US010636466B2

(12) United States Patent
Sasaki et al.

(10) Patent No.: US 10,636,466 B2
(45) Date of Patent: Apr. 28, 2020

(54) SPIN CURRENT ASSISTED MAGNETORESISTANCE EFFECT DEVICE

(71) Applicant: TDK CORPORATION, Tokyo (JP)

(72) Inventors: Tomoyuki Sasaki, Tokyo (JP); Tohru Oikawa, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/684,633

(22) Filed: Nov. 15, 2019

(65) Prior Publication Data

US 2020/0082861 A1 Mar. 12, 2020

Related U.S. Application Data

(62) Division of application No. 16/093,373, filed as application No. PCT/JP2017/019000 on May 22, 2017, now Pat. No. 10,497,417.

(30) Foreign Application Priority Data

Jun. 1, 2016 (JP) .................. 2016-110414

(51) Int. Cl.
*G11C 11/00* (2006.01)
*G11C 11/16* (2006.01)
(Continued)

(52) U.S. Cl.
CPC ............ *G11C 11/161* (2013.01); *G11C 11/16* (2013.01); *G11C 11/1675* (2013.01);
(Continued)

(58) Field of Classification Search
CPC .............. G11C 11/161; G11C 11/1673; G11C 11/1675
See application file for complete search history.

(56) References Cited

U.S. PATENT DOCUMENTS

RE45,832 E    1/2016 Maeda et al.
9,230,627 B2  1/2016 Wu et al.
(Continued)

FOREIGN PATENT DOCUMENTS

JP    2014-045196 A    3/2014
WO    2015/102739 A2   7/2015

OTHER PUBLICATIONS

I. M. Miron et al., "Perpendicular switching of a single ferromagnetic layer induced by in-plane current injection" Nature, vol. 476, pp. 189-194, 2011.
(Continued)

*Primary Examiner* — Tuan T Nguyen
(74) *Attorney, Agent, or Firm* — Oliff PLC

(57) ABSTRACT

A spin current assisted magnetoresistance effect device includes: a spin current assisted magnetoresistance effect element including a magnetoresistance effect element part and a spin-orbit torque wiring; and a controller electrically connected to the spin current assisted magnetoresistance effect element. In a portion in which the magnetoresistance effect element part and the spin-orbit torque wiring are bonded, an STT inversion current flowing through the magnetoresistance effect element part and an SOT inversion current flowing through the spin-orbit torque wiring merge or are divided, and the controller is configured to be capable of performing control for applying the STT inversion current to the spin current assisted magnetoresistance effect element at the same time as an application of the SOT inversion current or a time application of the SOT inversion current.

20 Claims, 9 Drawing Sheets

(51) Int. Cl.
  *H01L 21/8239* (2006.01)
  *H01L 43/08* (2006.01)
  *H01L 43/06* (2006.01)
  *H01L 43/02* (2006.01)
  *H01L 27/22* (2006.01)
  *H01F 10/32* (2006.01)
  *H01L 27/105* (2006.01)

(52) U.S. Cl.
  CPC ......... *H01F 10/324* (2013.01); *H01F 10/329* (2013.01); *H01F 10/3254* (2013.01); *H01L 21/8239* (2013.01); *H01L 27/105* (2013.01); *H01L 27/222* (2013.01); *H01L 43/02* (2013.01); *H01L 43/06* (2013.01); *H01L 43/08* (2013.01); *H01F 10/3286* (2013.01)

(56) References Cited

U.S. PATENT DOCUMENTS

| | | |
|---|---|---|
| 9,324,402 B2 | 4/2016 | Wu et al. |
| 9,514,827 B1 | 12/2016 | Nam et al. |
| 2013/0148430 A1 | 6/2013 | Shiino et al. |
| 2014/0056060 A1 | 2/2014 | Khvalkovskiy et al. |
| 2015/0003151 A1 | 1/2015 | Lee |
| 2015/0109853 A1* | 4/2015 | Sato .................. H01F 10/3286 365/158 |
| 2017/0206978 A1 | 7/2017 | Joo et al. |
| 2018/0247695 A1 | 8/2018 | Kasai et al. |
| 2019/0027680 A1* | 1/2019 | Min ....................... H01L 43/02 |

OTHER PUBLICATIONS

S. Fukami et al., "A spin-orbit torque switching scheme with collinear magnetic easy axis and current configuration", Nature Nanotechnology, pp. 1-6, 2016.

Aug. 15, 2017 International Search Report issued in International Patent Application No. PCT/JP2017/019000.

\* cited by examiner (a)

(b)

(a)

(b)

(a)

(b)

(a)

(b)

SPIN CURRENT ASSISTED MAGNETORESISTANCE EFFECT DEVICE

CROSS REFERENCE TO RELATED APPLICATION

This application is a divisional application of U.S. application Ser. No. 16/093,373, filed Oct. 12, 2018, the contents of which are incorporated herein by reference.

TECHNICAL FIELD

The present invention relates to a spin current assisted magnetoresistance effect device that can be applied to a high-frequency electronic component such as a magnetic head or a high-frequency filter, a magnetic memory, and the like. Priority is claimed on Japanese Patent Application No. 2016-110414, filed on Jun. 1, 2016, the content of which is incorporated herein by reference.

BACKGROUND ART

As magnetoresistance effect elements, a giant magnetoresistance (GMR) element formed by a multi-layered film with a ferromagnetic layer and a nonmagnetic layer and a tunnel magnetoresistance (TMR) element using an insulating layer (a tunnel barrier layer or a barrier layer) as a nonmagnetic layer are known. Generally, a TMR element has higher element resistance than a GMR element and has a magnetoresistance (MR) ratio higher than a GMR element. A TMR element has attracted attention as an element for a magnetic sensor, a high-frequency component, a magnetic head, and a nonvolatile RAM (MRAM).

As writing systems of an MRAM, a system performing writing (magnetization reversal) using a magnetic field generated by a current and a system performing writing (magnetization reversal) using a spin transfer torque (STT) generated by causing a current to flow in a lamination direction of a magnetoresistance element are known.

In the system using a magnetic field, there are cases in which, when the size of the element is decreased, there is a limit on a current that can flow through a thin wiring, and appropriate writing may not be able to be performed.

In contrast to this, in the system using a spin transfer torque (STT), ferromagnetic layers (a fixed layer and a reference layer) of one side perform spin polarization of a current, spin-polarized Spin is transferred to ferromagnetic layers of the other side (a free layer and a recording layer) using a current, and writing (magnetization reversal) is performed using a torque (STT) generated at that time. For this reason, the system using a spin transfer torque (STT) has an advantage that a current required for writing decreases as the element size decreases.

CITATION LIST

Non-Patent Literature

[Non-Patent Literature 1] I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).
[Non-Patent Literature 2] S. Fukami, T. Anekawa, C. Zhang, and H. Ohno, Nature Nanotechnology, DOI:10.1038/NNANO.2016.29.

SUMMARY OF INVENTION

Technical Problem

While the magnetization reversal of a TMR element using an STT is efficient from the viewpoint of energy efficiency, there is a problem in that the inversion current density for the magnetization reversal is high. From the viewpoint of a long life of a TMR element, it is preferable that this inversion current density be low. This point is similar for a GMR element.

Accordingly, in either magnetoresistance effect element from a TMR element and a GMR element, it is preferable to decrease a current density flowing through the magnetoresistance effect element.

There is a time delay in a TMR element using an STT until magnetization reversal occurs after an application of an inversion current, and time is required for recording.

The magnetization reversal using an STT occurs in accordance with precession of magnetization induced inside a free layer. The precession of magnetization gradually increases in accordance with the application of an inversion current. For this reason, the magnetization reversal using an STT has a time delay until magnetization reversal occurs from the application of an inversion current in principle.

In recent years, it has been proposed that magnetization reversal using a pure spin current generated in accordance with a spin-orbit interaction could be applied (for example, Non Patent Literature 1). A pure spin current that has undergone spin-orbit-interaction induces a spin-orbit torque (SOT) and causes magnetization reversal in accordance with the SOT. The pure spin current is generated by causing the same number of electrons having an upward Spin and electrons having a downward Spin to flow in opposite directions, the flows of the electric charge canceling each other out, and the amount of current being generated in accordance with the pure spin current being zero. When magnetization can be reversed only using a pure spin current, a current flowing through the MR element is zero, and the magnetoresistance effect element can be expected to have a long life.

In Non Patent Literature 2, in magnetization reversal using an SOT, a phenomenology in which magnetization reversal occurs is described (see FIG. 1 of Non Patent Literature 2). The magnetization reversal using an SOT does not necessarily occur while precession is performed. In other words, the mechanism of the magnetization reversal using an SOT is different from that of the magnetization reversal using an STT.

In this way, the magnetization reversal using an SOT occurs via a characteristic mechanism and thus has attracted attention. However, a current density for generating a pure spin current of a degree for magnetization reversal is higher than a current density in a case in which an STT is used, and accordingly, it is difficult to realize a magnetoresistance effect element reversing magnetization only using a pure spin current.

The present invention has been realized in view of the problems described above, and an object thereof is to provide a spin current assisted magnetoresistance effect device that can assist magnetization reversal of a magnetoresistance effect element using a pure spin current and has a high writing speed.

Solution to Problem

As a means for assisting magnetization reversal of a magnetoresistance effect element, a means applying an external magnetic field, a means using distortion of a material, a means applying heat, or a means applying a voltage is known.

In contrast to this, the present invention uses an SOT according to a pure spin current as a means for assisting magnetization reversal in a magnetoresistance effect element reversing the magnetization using an STT, and an inverted current density for the magnetization reversal can be decreased. In addition, at the time of magnetization reversal, a time required for the magnetization reversal can be decreased by controlling a current applied to the element. In order to solve the problems described above, the present invention provides the following means.

(1) According to one aspect of the present invention, there is provided a spin current assisted magnetoresistance effect device including: a spin current assisted magnetoresistance effect element including a magnetoresistance effect element part, which includes a first ferromagnetic metal layer configured for a magnetization direction to be fixed, a second ferromagnetic metal layer configured for a magnetization direction to be changed, and a nonmagnetic layer interposed between the first ferromagnetic metal layer and the second ferromagnetic metal layer, and a spin-orbit torque wiring extending in a direction intersecting a lamination direction of the magnetoresistance effect element part and bonded to the second ferromagnetic metal layer; and a controller electrically connected to the magnetoresistance effect element part of the spin current assisted magnetoresistance effect element and the spin-orbit torque wiring. In a portion in which the magnetoresistance effect element part of the spin current assisted magnetoresistance effect element and the spin-orbit torque wiring are bonded, an STT inversion current flowing through the magnetoresistance effect element part and an SOT inversion current flowing through the spin-orbit torque wiring merge or are divided, and the controller is configured to be capable of performing control for applying the STT inversion current to the spin current assisted magnetoresistance effect element at the same time as that of applying the SOT inversion current or at a time after an application of the SOT inversion current.

(2) In the spin current assisted magnetoresistance effect device according to the aspect described above, the controller may be configured to perform control for stopping an application of the STT inversion current to the spin current assisted magnetoresistance effect element at a time after stopping an application of the SOT inversion current.

(3) In the spin current assisted magnetoresistance effect device according to the aspect described above, the controller may perform control for stopping an application of the SOT inversion current at a time after an application of the STT inversion current to the spin current assisted magnetoresistance effect element or a time that is simultaneous with the application.

(4) In the spin current assisted magnetoresistance effect device according to the aspect described above, a time until stopping the application of the SOT inversion current and the STT inversion current after an application of the SOT inversion current may be 10 nsec or less.

(5) In the spin current assisted magnetoresistance effect device according to the aspect described above, a direction of magnetization of the second ferromagnetic metal layer and a direction of spin supplied from the spin-orbit torque wiring to the second ferromagnetic metal layer may intersect each other.

(6) In the spin current assisted magnetoresistance effect device according to the aspect described above, a current density of the STT inversion current applied by the controller may be lower than a threshold inversion current density required for reversing the magnetization of the second ferromagnetic metal layer of the magnetoresistance effect element part.

Advantageous Effects of Invention

According to the present invention, a spin current assisted magnetoresistance effect device that can assist magnetization reversal of a magnetoresistance effect element part using a pure spin current and has a high writing speed can be realized.

BRIEF DESCRIPTION OF DRAWINGS

FIG. 3(a) is a cross-sectional view, and FIG. 3(b) is a plan view.

FIG. 4(a) is a cross-sectional view, and FIG. 4(b) is a plan view.

FIG. 5(a) is a cross-sectional view, and FIG. 5(b) is a plan view.

FIG. 6(a) is a cross-sectional view, and FIG. 6(b) is a plan view.

DESCRIPTION OF EMBODIMENTS

Figure 1:
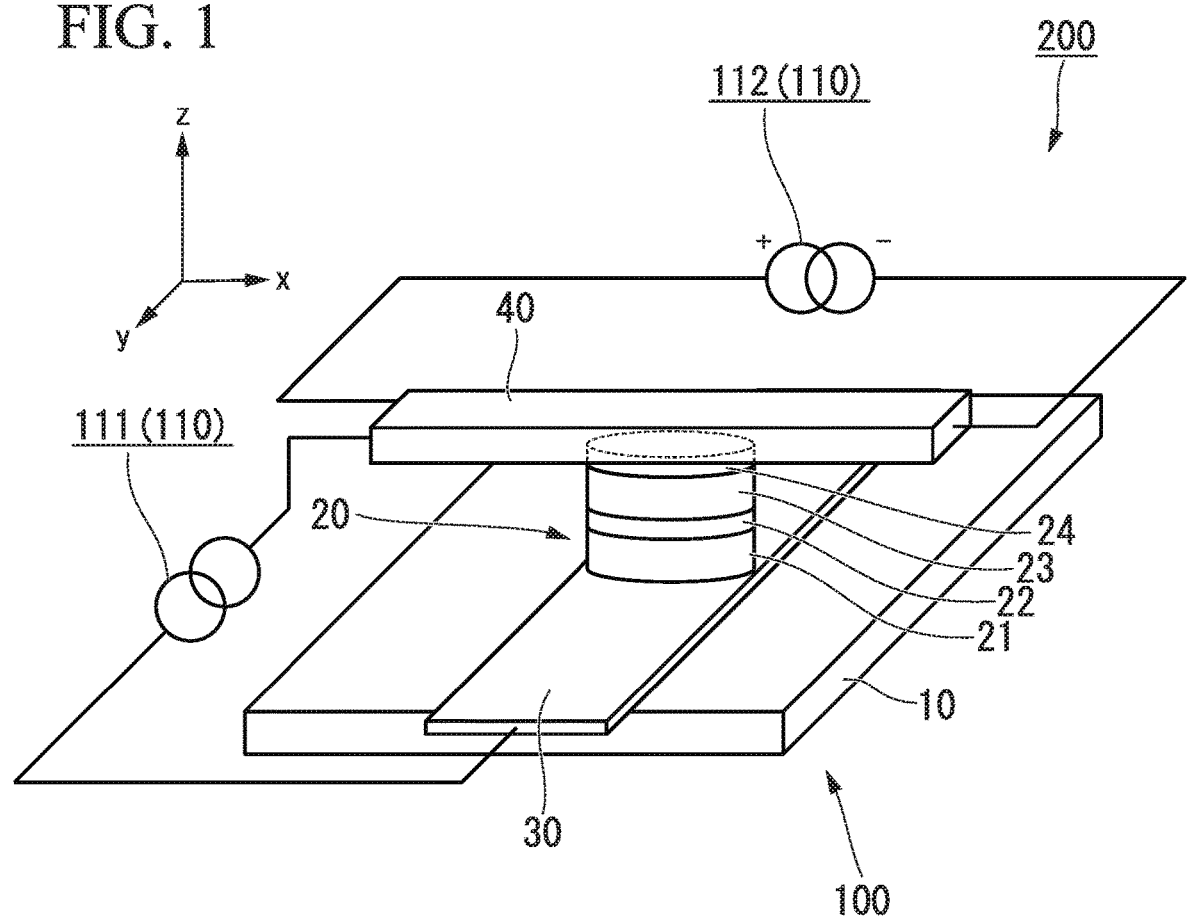
FIG. 1 is a perspective view schematically illustrating a spin current assisted magnetoresistance effect device according to one embodiment.

Hereinafter, embodiments will be described in detail with reference to the drawings. In the drawings used in the following description, in order to allow easy understanding of aspects of the embodiments, characteristic portions may be represented in enlarged Scales for the convenience of the description, and the dimensions, the proportions, and the like of each constituent element may be different from actual values thereof. Materials, dimensions, and the like represented in the following description are examples, and thus, the embodiments are not limited thereto, and may be appropriately changed in a range in which the effects of the embodiments are accomplished.

(Spin Current Assisted Magnetoresistance Effect Device)

FIG. 1 is a perspective view schematically illustrating a spin current assisted magnetoresistance effect device according to this embodiment. The spin current assisted magnetoresistance effect device 200 illustrated in FIG. 1 includes a spin current assisted magnetoresistance effect element 100 and a controller 110.

Hereinafter, each component will be described more specifically.

(Spin Current Assisted Magnetoresistance Effect Element)

The spin current assisted magnetoresistance effect element 100 includes a magnetoresistance effect element part 20 and a spin-orbit torque wiring 40. The spin-orbit torque wiring 40 extends in a direction intersecting a lamination direction of the magnetoresistance effect element part 20 and is bonded to the magnetoresistance effect element part 20.

Hereinafter, including FIG. 1, as an example of the configuration in which the spin-orbit torque wiring extends in the direction intersecting the lamination direction of the magnetoresistance effect element part, a configuration in which the spin-orbit torque wiring and the magnetoresistance effect element part are orthogonal to each other will be described.

In FIG. 1, a wiring 30 used for causing a current to flow in the lamination direction of the magnetoresistance effect element part 20 and a substrate 10 forming the wiring 30 are also illustrated.

Hereinafter, the lamination direction of the magnetoresistance effect element part 20 will be set as a direction z, a direction that is perpendicular to the direction z and is parallel to the spin-orbit torque wiring 40 will be set as a direction x, and a direction orthogonal to the direction x and the direction z will be set as a direction y.

<Magnetoresistance Effect Element Part>

The magnetoresistance effect element part 20 includes: a first ferromagnetic metal layer 21 of which the magnetization direction is fixed; a second ferromagnetic metal layer 23 of which the magnetization direction changes; and a nonmagnetic layer 22 interposed between the first ferromagnetic metal layer 21 and the second ferromagnetic metal layer 23.

By relatively changing the magnetization direction of the second ferromagnetic metal layer 23 with respect to the magnetization of the first ferromagnetic metal layer 21 fixed in one direction, the magnetoresistance effect element part 20 functions as a magnetoresistance effect element. In the case of an application to an MRAM of a coercive force difference type (pseudo spin valve type), the coercive force of the first ferromagnetic metal layer is configured to be higher than the coercive force of the second ferromagnetic metal layer. In the case of an application to an MRAM of an exchange bias type (spin valve type), the magnetization direction of the first ferromagnetic metal layer is fixed using exchange bonding with an antiferromagnetic layer.

The magnetoresistance effect element part 20 is a tunneling magnetoresistance (TMR) element in a case in which the nonmagnetic layer 22 is formed from an insulating layer and is a giant magnetoresistance (GMR) element in a case in which the nonmagnetic layer 22 is formed from metal.

For the magnetoresistance effect element part included in this embodiment, the configuration of a known magnetoresistance effect element may be used. For example, each layer may be formed from a plurality of layers or may include another layer such as an antiferromagnetic layer used for fixing the magnetization direction of the first ferromagnetic metal layer. The first ferromagnetic metal layer 21 is called a fixed layer or a reference layer, and the second ferromagnetic metal layer 23 is called a free layer, a recording layer, or the like.

The first ferromagnetic metal layer 21 and the second ferromagnetic metal layer 23 may be either in-plane magnetization films of which the magnetization direction is an in-plane direction parallel to the layer or vertical magnetization films of which the magnetization direction is a direction perpendicular to the layer.

As the material of the first ferromagnetic metal layer 21, a known material may be used. For example, a metal selected from among a group formed from Cr, Mn, Co, Fe, and Ni and alloys, which exhibit ferromagnetic properties, containing one or more of such metals may be used. In addition, an alloy containing such a metal and at least one or more elements from B, C, and N may be used as the material of the first ferromagnetic metal layer 21. More specifically, examples thereof include Co—Fe and Co—Fe—B.

In order to acquire a higher output, it is preferable to use a Heusler alloy such as $Co_2FeSi$ for the first ferromagnetic metal layer 21. A Heusler alloy contains an intermetallic compound having a chemical composition of $X_2YZ$. Here, X is a transition metal element from the Co, Fe, Ni, or Cu groups or a noble metal element in the periodic table, Y is a transition metal from the Mn, V, Cr, or Ti groups or an element kind from the groups for X, and Z is a typical element from Group III to Group V. Examples of the Heusler alloy include $Co_2FeSi$, $Co_2MnSi$, $Co_2Mn_{1-a}Fe_aAl_bSi_{1-b}$, and the like.

In order to increase the coercive force of the first ferromagnetic metal layer 21 with respect to the second ferromagnetic metal layer 23, an antiferromagnetic material such as IrMn or PtMn may be used as a material brought into contact with the first ferromagnetic metal layer 21. In order to prevent a leaked magnetic field of the first ferromagnetic metal layer 21 influencing the second ferromagnetic metal layer 23, a structure of a synthetic ferromagnetic coupling may be used.

In a case in which the direction of the magnetization of the first ferromagnetic metal layer 21 is perpendicular to the stacking face, it is preferable to use a Co or Pt stacking film in the first ferromagnetic metal layer 21. More specifically, for the first ferromagnetic metal layer 21, [Co(0.24 nm)/Pt (0.16 nm)]$_6$/Ru(0.9 nm)/[Pt(0.16 nm)/Co(0.16 nm)]4/Ta(0.2 nm)/FeB(1.0 nm) may be used.

As the material of the second ferromagnetic metal layer 23, a ferromagnetic material, more particularly, a soft magnetic material may be used. For example, a metal selected from among a group formed from Cr, Mn, Co, Fe, and Ni, an alloy containing one or more of such metals, an alloy containing such metals and at least one or more of B, C, and N, or the like may be used as the material of the second ferromagnetic metal layer 23. More specifically, examples thereof include Co—Fe, Co—Fe—B, and Ni—Fe.

In a case in which the direction of the magnetization of the second ferromagnetic metal layer 23 is perpendicular to the stacking face, it is preferable to configure the thickness of the second ferromagnetic metal to be 2.5 nm or the less. In an interface between the second ferromagnetic metal layer 23 and the nonmagnetic layer 22, vertical magnetic anisotropy may be added to the second ferromagnetic metal layer 23. When the film thickness of the second ferromagnetic metal layer 23 is increased, the effect of the vertical magnetic anisotropy causing magnetization to face toward the direction perpendicular to the stacking face attenuates, and accordingly, it is preferable that the film thickness of the second ferromagnetic metal layer 23 be small.

For the nonmagnetic layer 22, a known material may be used.

For example, in a case in which the nonmagnetic layer 22 is formed from an insulator (in the case of a tunnel barrier layer), as the material thereof, $Al_2O_3$, $SiO_2$, MgO, $MgAl_2O_4$, or the like may be used. In addition, other than such materials, a material acquired by substituting a part of Al, Si, or Mg with Zn, Be, or the like may be used for the nonmagnetic layer 22. Among such materials, MgO and $MgAl_2O_4$ are materials that can realize coherent tunneling, whereby spin can be efficiently injected into an adjacent magnetic metal layer.

In a case in which the nonmagnetic layer 22 is formed from a metal, Cu, Au, Ag, or the like may be used as the material thereof.

On a face of the second ferromagnetic metal layer 23 that is opposite to the nonmagnetic layer 22, as illustrated in FIG. 1, a cap layer 24 is preferably formed. The cap layer 24 can suppress diffusion of elements from the second ferromagnetic metal layer 23. In addition, the cap layer 24 contributes also to the crystal orientation of each layer of the magnetoresistance effect element part 20. By disposing the cap layer 24, the magnetization of the first ferromagnetic metal layer 21 and the second ferromagnetic metal layer 23 of the magnetoresistance effect element part 20 is stabilized, and the resistance of the magnetoresistance effect element part 20 can be lowered.

It is preferable to use a material having high conductivity for the cap layer 24. For example, Ru, Ta, Cu, Ag, or Au may be used. It is preferable to appropriately set the crystal structure of the cap layer 24 to an fcc structure, an hcp structure, or a bcc structure in accordance with the crystal structure of an adjacent ferromagnetic metal layer.

For the cap layer 24, it is preferable to use any one selected from among a group formed from silver, copper, magnesium, and aluminum. While details will be described later, in a case in which the spin-orbit torque wiring 40 and the magnetoresistance effect element part 20 are connected through the cap layer 24, it is preferable for the cap layer 24 not to disperse the spin propagating from the spin-orbit torque wiring 40. Silver, copper, magnesium, aluminum, and the like have long spin dispersion lengths of 100 nm or more, and thus it is difficult for the spin to be dispersed therewith.

The thickness of the cap layer 24 is preferably a spin diffusion length of the material composing the cap layer 24 or less. In a case in which the thickness of the cap layer 24 is the spin diffusion length or less, spin propagating from the spin-orbit torque wiring 40 can be sufficiently delivered to the magnetoresistance effect element part 20.

<Spin-Orbit Torque Wiring>

The spin-orbit torque wiring 40 extends in a direction intersecting the lamination direction of the magnetoresistance effect element part 20. The spin-orbit torque wiring 40 is electrically connected to a power supply causing a current to flow in a direction intersecting the lamination direction of the magnetoresistance effect element part 20 and functions as a spin injecting means injecting a pure spin current into the magnetoresistance effect element part together with the power supply.

The spin-orbit torque wiring 40 may be either directly connected to the second ferromagnetic metal layer 23 or connected thereto via another layer. For example, as illustrated in FIG. 1, the spin-orbit torque wiring 40 and the second ferromagnetic metal layer 23 may be connected via the cap layer 24.

The spin-orbit torque wiring 40 is formed from a material generating a pure spin current in accordance with a spin Hall effect when a current flows through it. As such a material, a material having a composition causing a pure spin current to be generated in the spin-orbit torque wiring may be used. Thus, the spin-orbit torque wiring 40 is not limited to being composed from a single element but may be formed from a portion composed using a material generating a pure spin current and a portion composed using a material not generating a pure spin current or the like.

The spin Hall effect is a phenomenon in which a pure spin current is induced in a direction orthogonal to the direction of the orientation of the current on the basis of a spin-orbit interaction in a case in which a current flows through a material.

Figure 2:
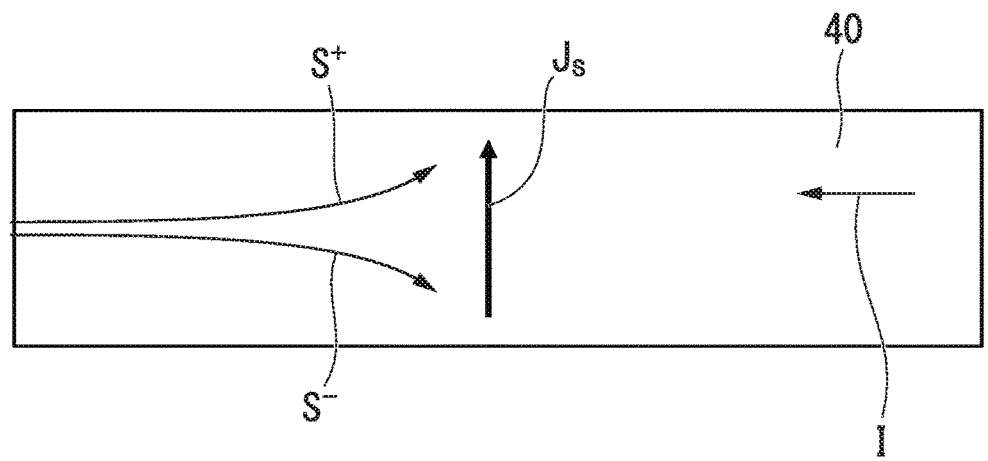
FIG. 2 is a schematic view illustrating a spin Hall effect.

FIG. 2 is a schematic view illustrating a spin Hall effect. A mechanism in which a pure spin current is generated in accordance with the spin Hall effect will be described on the basis of FIG. 2.

As illustrated in FIG. 2, when a current I flows in the extending direction of the spin-orbit torque wiring 40, each of upward Spin $S^+$ and downward Spin $S^-$ bends in a direction orthogonal to the current. A general Hall effect and the spin Hall effect are the same in that the moving direction of moving electric charge (electrons) bends. On the other hand, while the moving direction of charged particles moving inside a magnetic field bends by receiving a Lorentz force in the general Hall effect, the moving direction bends in accordance with only the movement of electrons (only the flow of a current) without the presence of a magnetic field in the spin Hall effect, which is different from the case of the general Hall effect.

In a nonmagnetic substance (a material that is not a ferromagnetic body), the number of electrons having upward Spin $S^+$ and the number of electrons having downward Spin $S^-$ are the same, and the number of electrons having upward Spin $S^+$ facing toward the upper side in the drawing and the number of electrons having downward Spin $S^-$ facing the lower side are the same. For this reason, a current as a net flow of electric charge is zero. A spin current not accompanying this current is particularly called a pure spin current.

On the other hand, also in a case in which a current flows in a ferromagnetic body, upward-spin electrons and downward-spin electrons are bent in opposite directions. However, in the ferromagnetic body, a state is formed in which there are many of one of upward-spin electrons or downward-spin electrons, and, as a result, a net flow of electric charge occurs (a voltage is generated). Thus, in the material of the spin-orbit torque wiring, a material formed only from a ferromagnetic body is not included.

Here, when the flow of electrons having upward Spin $S^+$ is denoted by $J_\uparrow$, the flow of electrons having downward Spin $S^-$ is denoted by $J_\downarrow$, and a spin current is denoted by $J_S$, the spin current is defined as $J_S=J_\uparrow-J_\downarrow$. In the case illustrated in FIG. 2, $J_S$ flows in the upward direction in the drawing as a pure spin current. Here, $J_S$ is the flow of electrons of which a polarizability is 100%. In the case illustrated in FIG. 2, when a ferromagnetic body is brought into contact with an upper face of the spin-orbit torque wiring 40, the pure spin current diffuses and flows into the ferromagnetic body.

In this embodiment, a pure spin current is generated by causing a current to flow through the spin-orbit torque wiring in this way, and the pure spin current diffuses into the second ferromagnetic metal layer that is in contact with the spin-orbit torque wiring. In accordance with the pure spin current that has diffused into the second ferromagnetic metal layer, a spin-orbit torque (SOT) effect occurs, and the magnetization reversal of the second ferromagnetic metal layer that is a free layer is assisted.

As methods of assisting the magnetization reversal, a method of applying an external magnetic field, a method of applying a voltage, a method of adding heat, and a method using distortion of a material are known. However, in the case of the method of applying an external magnetic field, the method of applying a voltage, or the method of applying heat, it is necessary to provide additional external wiring, a heat generation source, and the like, and the element configuration becomes complex. In the case of the method using distortion of a material, it is difficult to control distortion that occurs once in a utilization form, and magnetization reversal may not be able to be performed with good controllability.

The spin-orbit torque wiring 40 may contain a nonmagnetic heavy metal. Here, a heavy metal is used with the meaning of a metal having a specific gravity of that of yttrium or more. The spin-orbit torque wiring 40 may be formed only from a nonmagnetic heavy metal.

The nonmagnetic heavy metal is preferably a nonmagnetic metal, which has d-electrons or f-electrons in the outermost shell, having a large atomic number of 39 or more. Such a nonmagnetic metal has a large spin-orbit interaction causing the spin Hall effect. The spin-orbit torque wiring 40 may be formed only from a nonmagnetic metal, which has d electrons or f electrons in the outermost shell, having a large atomic number of 39 or more.

Normally, when a current flows in a metal, all the electrons move in a direction opposite to that of the current regardless of the orientation of the spin. In contrast to this, a nonmagnetic metal, which has d electrons or f electrons in the outermost shell, having a large atomic number and having a large spin-orbit interaction has a direction of movement of electrons which depends on the orientation of the spin of electrons according to the spin Hall effect. For this reason, a nonmagnetic metal, which has d electrons or f electrons in the outermost shell, having a large atomic number easily generates a pure spin current $J_S$.

The spin-orbit torque wiring 40 may contain a magnetic metal. A magnetic metal indicates a ferromagnetic metal or an antiferromagnetic metal. When a small amount of magnetic metal is included in the nonmagnetic metal, a spin-orbit interaction is reinforced, and Spin current generation efficiency with respect to a current flowing through the spin-orbit torque wiring 40 is increased. The spin-orbit torque wiring 40 may be formed only from an antiferromagnetic metal.

The spin-orbit interaction is generated in accordance with a unique inner field of the material of the spin-orbit torque wiring material, and a pure spin current is generated also in a nonmagnetic material. When a small amount of magnetic metal is added to the spin-orbit torque wiring material, the magnetic metal scatters flowing electron spins, and the spin current generation efficiency is improved. Here, when the amount of addition of a magnetic metal is increased too much, the generated pure spin current is scattered by the added magnetic metal, and, as a result, the spin current is decreased. Accordingly, it is preferable that the molar proportion of the added magnetic metal is sufficiently smaller than the molar proportion of the main component of a pure spin generating part of the spin-orbit torque wiring. The molar proportion of the added magnetic metal is preferably 3% or less as a reference.

The spin-orbit torque wiring 40 may contain a topological insulator. The spin-orbit torque wiring 40 may be formed only from a topological insulator. The topological insulator is a material, of which the inside is an insulator or a resistor of high resistance, having a surface in which a spin-polarized metal state occurs. In this material, an inner magnetic field called a spin-orbit interaction is generated. For this reason, a new topological phase is formed in accordance with the effect of the spin-orbit interaction even without an external magnetic field. In such a topological insulator, a pure spin current can be generated with high efficiency in accordance with a strong spin-orbit interaction and destruction of inversion symmetry in the edge.

As a topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like is preferably used. Such a topological insulator can generate a spin current with high efficiency.

<Substrate>

It is preferable that the substrate 10 have superior flatness. As the substrate 10, Si, AlTiC, or the like may be used, and, by using such a material, a surface having superior flatness is acquired.

It is preferable that an insulating layer be disposed on the substrate 10. A current flowing through the wiring 30 and the like can be prevented from being dispersed. As the insulating layer, a layer of an oxide having a (001)-aligned NaCl structure and containing at least one element selected from a group formed from Mg, Al, and Ce is preferably used. By using such a material as the insulating layer, the crystallinity of the insulating layer is applied to the lamination film stacked on the insulating layer, and the crystalline orientation of the lamination film is improved. In addition, as the insulating layer, a nitride insulating material such as SiNx may be used.

On a face of the substrate 10 that is disposed on the side of the magnetoresistance effect element part 20, an underlayer (not illustrated in the drawing) may be formed. By disposing the underlayer, the crystallinity such as the crystal orientation and a crystal grain size of each layer including the first ferromagnetic metal layer 21 stacked on the substrate 10 can be controlled.

For example, as one example of the underlayer, a nitride layer having a (001)-aligned NaCl structure and containing at least one element selected from among a group of Ti, Zr, Nb, V, Hf, Ta, Mo, W, B, Al, and Ce may be used.

As another example of the underlayer, a layer of a (002)-aligned Perovskite-type conductive oxide represented using a compositional formula of $ABO_3$ may be used. Here, the A site includes at least one element selected from a group of Sr, Ce, Dy, La, K, Ca, Na, Pb, and Ba, and the site B includes at least one element selected from a group of Ti, V, Cr, Mn, Fe, Co, Ni, Ga, Nb, Mo, Ru, Jr, Ta, Ce, and Pb.

As another example of the underlayer, a layer having a (001)-aligned tetragonal crystal or cubic crystal structure and including at least one element selected from among a group of Al, Cr, Fe, Co, Rh, Pd, Ag, Jr, Pt, Au, Mo, and W may be used.

The underlayer is not limited to one layer, and each exemplary layer described above may be stacked to form a plurality of layers. By devising the configuration of the underlayer, the crystallinity of each layer of the magnetoresistance effect element part 20 may be increased, and the magnetic characteristics can be improved.

<Wiring>

The wiring 30 is electrically connected to the first ferromagnetic metal layer 21 of the magnetoresistance effect element part 20. In the case illustrated in FIG. 1, the wiring 30, the spin-orbit torque wiring 40, and the power supply (not illustrated in the drawing) configure a closed circuit, and a current is caused to flow in the lamination direction of the magnetoresistance effect element part 20.

The material of the wiring 30 is not particularly limited as long has it has high conductivity. For example, aluminum, silver, copper, gold, or the like may be used as the material.
(Controller)

The controller 110 is electrically connected to the magnetoresistance effect element part 20 and the spin-orbit torque wiring 40 of the spin current assisted magnetoresistance effect element 100. The controller 110 controls a current caused to flow through the magnetoresistance effect element part 20 for using the STT effect (hereinafter, it may be referred to as a "STT inversion current") and a current caused to flow through the spin-orbit torque wiring 40 for using the SOT effect (hereinafter, it may be referred to as an "SOT inversion current").

The configuration of the controller 110 is not particularly limited as long as the STT inversion current and the STO inversion current can be controlled thereby. Hereinafter, as illustrated in FIG. 1, a case will be described in which the controller 110 is formed from a first power supply 111 and a second power supply 112.

The first power supply 111 is connected to the wiring 30 and the spin-orbit torque wiring 40. The first power supply 111 can control an STT inversion current flowing in the lamination direction of the spin current assisted magnetoresistance effect element 100. As the first power supply 111, a known power supply can be used.

The second power supply 112 is connected to both ends of the spin-orbit torque wiring 40. The second power supply 112 can control the SOT inversion current flowing through the spin-orbit torque wiring 40. In the case illustrated in FIG. 1, the SOT inversion current flows in a direction orthogonal to the lamination direction of the magnetoresistance effect element part 20. As the second power supply 112, a known power supply can be used.

From the left end of the spin-orbit torque wiring 40 illustrated in the drawing to the magnetoresistance effect element part 20, there are cases in which the STT inversion current and the SOT inversion current are applied in a superimposed manner. Also in such cases, a part of the current flowing in the direction orthogonal to the lamination direction of the magnetoresistance effect element part 20 that contributes to the SOT inversion current is controlled by the second power supply 112.

"Specific Configuration of Spin-Orbit Torque Wiring"

Subsequently, a specific configuration of a spin-orbit torque wiring formed in consideration of the actual driving of the spin current assisted magnetoresistance effect device will be described.

FIGS. 3 to 6 are schematic diagrams illustrating spin-orbit torque wirings according to embodiments, (a) is a cross-sectional view, and (b) is a plan view.

As currents controlled by the controller 110 for magnetization reversal of the magnetoresistance effect element part 20, there are an STT inversion current and an SOT inversion current. Each of the currents is a normal current accompanying the flow of electric charge, and thus, when the current flows, Joule heat is generated.

A spin current assisted magnetoresistance effect device according to this embodiment assists magnetization reversal using the STT effect with the SOT effect. For this reason, the current density of the STT inversion current is lower than a threshold inversion current density that is required for magnetization reversal using only the STT effect. Meanwhile, the spin current assisted magnetoresistance effect device consumes an amount of energy corresponding to the SOT inversion current.

The spin-orbit torque wirings according to the embodiments illustrated in FIGS. 3 to 6 are examples of a configuration for decreasing Joule heat generated in accordance with the SOT inversion current using a configuration other than that described above.

A heavy metal that is a material that can generate a pure spin current has a higher electrical resistance than that of a metal used for a general wiring.

For this reason, from a viewpoint of decreasing Joule heat generated in accordance with the SOT inversion current, it is more preferable for the spin-orbit torque wiring to have a portion of which the electric resistance is small than to be formed only using a material that can generate a pure spin current. In other words, it is preferable for the spin-orbit torque wiring to have a part formed using a material generating a pure spin current (spin current generating part) and a part formed using a material having an electrical resistance lower than that of the spin current generating part (low resistance part).

The spin current generating part may be formed using a material that can generate a pure spin current and, for example, may have a constitution of being formed from parts made from materials of a plurality of types or the like.

For the low resistance part, a material that is used for a general wiring may be used. For example, aluminum, silver, copper, gold, or the like may be used as the material. The low resistance part may be formed from a material having a lower electrical resistance than the spin current generating part and, for example, may have a configuration formed from parts of a plurality of kinds of materials or the like.

In the low resistance part, a pure spin current may be generated. In such a case, differentiation between the spin current generating part and the low resistance part can be performed by determining that a part formed using a material described as the material of the spin current generating part or the low resistance part in this specification is the spin current generating part or the low resistance part. A part, which is a part other than a main part generating a pure spin current, having an electrical resistance lower than that of the main part can be determined as a low resistance part to be differentiated from the spin current generating part.

The spin current generating part may contain a nonmagnetic heavy metal. In such a case, the heavy metal that can generate a pure spin current may be included to a limited extent. It is preferable that the compositional proportion of the heavy metal that can generate a pure spin current be sufficiently smaller than that of the main component of the spin current generating part or account for a main component (for example, 90% or more) of the spin current generating part. In a case in which the heavy metal accounts for the main component of the spin current generating part, it is preferable that the spin current generating part is composed only from a nonmagnetic metal, which has d electrons or f electrons in the outermost shell, of an atomic number 39 or more.

Here, there being sufficiently less of the heavy metal that can generate the pure spin current than the main component of the spin current generating part, for example, indicates the concentration of the heavy metal in the spin current generating part having copper as its main component having a molar proportion of 10% or less. In a case in which the main component composing the spin current generating part is formed from a material other than the heavy metal described above, the density of the heavy metal contained in the spin current generating part is preferably a molar proportion of 50% or less and is more preferably a molar proportion of 10% or less.

If the concentration of the heavy metal is within this range, the effect of electron spins scattering can be effectively obtained. In a case in which the density of the heavy metal is low, a light metal having an atomic number less than that of the heavy metal accounts for the main component of the spin current generating part.

In this case, it is assumed that atoms of the heavy metal disorderly disperse in the light metal instead of the heavy metal forming an alloy with the light metal. In the light metal, since the spin-orbit interaction is weak, it is difficult to generate a pure spin current using a spin Hall effect. However, when electrons pass through a heavy metal included in a light metal, there is an effect of scattering spin also in the interface between the light metal and the heavy metal, and accordingly, a pure spin current can be efficiently generated also in an area in which the density of the heavy metal is low.

In a case in which the density of the heavy metal exceeds 50%, although the ratio of the spin Hall effect in the heavy metal increases, the effect of the interface between the light metal and the heavy metal reduces, and accordingly, the overall effect is reduced. Therefore, it is preferable that the concentration of the heavy metal is that at which it can be expected that this effect of the interface will be sufficient.

In addition, in a case in which the spin-orbit torque wiring described above includes a magnetic metal, an antiferromagnetic metal can be used in the spin current generating part in the spin-orbit torque wiring. By using the antiferromagnetic metal, the same effects as those in a case of using 100% of a nonmagnetic metal of heavy metal, which has d electrons or f electrons in the outermost shell, of an atomic number 39 or more can be acquired. The antiferromagnetic metal, for example, is preferably IrMn or PtMn and is more preferably IrMn that is stable with respect to heat.

In a case in which the spin-orbit torque wiring described above includes a topological insulator, the spin current generating part of the spin-orbit torque wiring may be formed from a topological insulator. As the topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like is preferable. Such a topological insulator can generate a spin current with high efficiency.

In order for the pure spin current generated in the spin-orbit torque wiring to effectively diffuse into the magnetoresistance effect element part, it is preferable that at least a part of the spin current generating part be in contact with the second ferromagnetic metal layer. In a case in which a cap layer is included, it is preferable that at least a part of the spin current generating part be in contact with the cap layer. All the spin-orbit torque wirings 40 according to the embodiments illustrated in FIGS. 3 to 6 have a configuration in which at least a part of the spin current generating part is in contact with the second ferromagnetic metal layer.

Figure 3:
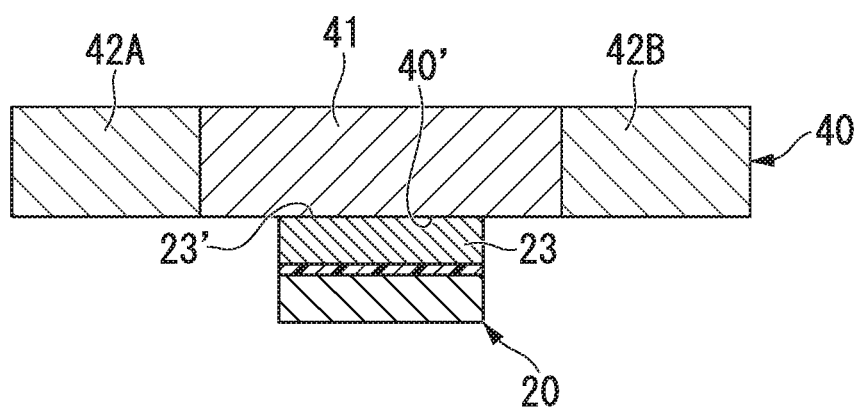
FIG. 3 is a schematic view illustrating a spin-orbit torque wiring according to one embodiment.
Figure 3:
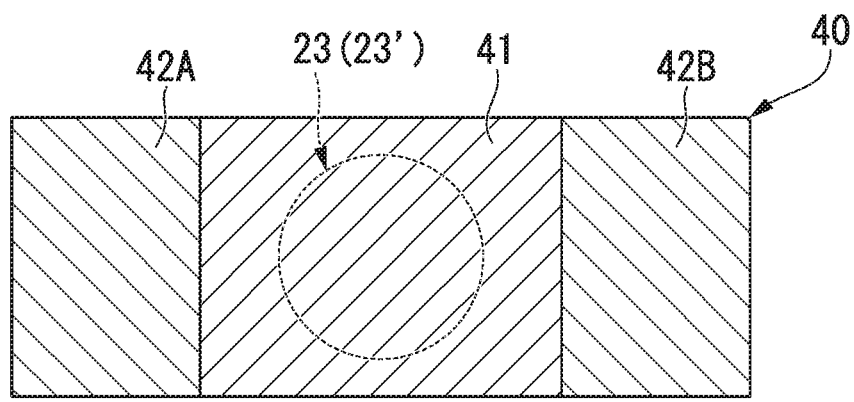

In the embodiment illustrated in FIG. 3, the whole junction 40' of the spin-orbit torque wiring 40 bonded to the second ferromagnetic metal layer is formed from a spin current generating part 41, and the spin current generating part 41 is configured to be interposed between low resistance parts 42A and 42B.

In a case in which the spin current generating part and the low resistance parts are disposed electrically in parallel with each other, a current flowing through the spin-orbit torque wiring is divided according to the reciprocal of the ratio of the magnitude of the resistance of the spin current generating part to the resistance of the low resistance parts, and Separate currents flows through each of the parts.

In order to cause all the current flowing through the spin-orbit torque wiring to flow through the spin current generating part, it is preferable that all the parts be disposed electrically in series without having a portion in which the spin current generating part and the low resistance part are disposed electrically in parallel with each other. The efficiency of generation of a pure spin current for the SOT inversion current can then be increased.

Spin-orbit torque wirings illustrated in FIGS. 3 to 6 have a configuration of not having a portion in which the spin current generating part and the low resistance part are disposed electrically in parallel with each other in the plan view in the lamination direction of a magnetoresistance effect element part and is a case of a configuration having the highest efficiency of generation of a pure spin current with respect to an SOT inversion current among configurations having a cross-section illustrated in (a).

The spin-orbit torque wiring 40 shown in FIG. 3 is superimposed Such that the spin current generating part 41 includes the junction 23' of the second ferromagnetic metal layer 23 in a plan view in the laminating direction of the magnetoresistance effect element portion 20. A portion of the spin-orbit torque wiring 40 overlapping with the magnetoresistance effect element part 20 in the thickness direction is formed only from the spin current generating part 41, and low resistance parts 42A and 42B have the spin current generating part 41 interposed therebetween in a direction in which the current flows. As a modified example of the spin-orbit torque wiring illustrated in FIG. 3, a spin current generating part may overlap with a junction of a second ferromagnetic metal layer in the plan view from the lamination direction of the magnetoresistance effect element part. In the modified example, points other than these differences are the same as in the spin-orbit torque wiring illustrated in FIG. 3.

Figure 4:
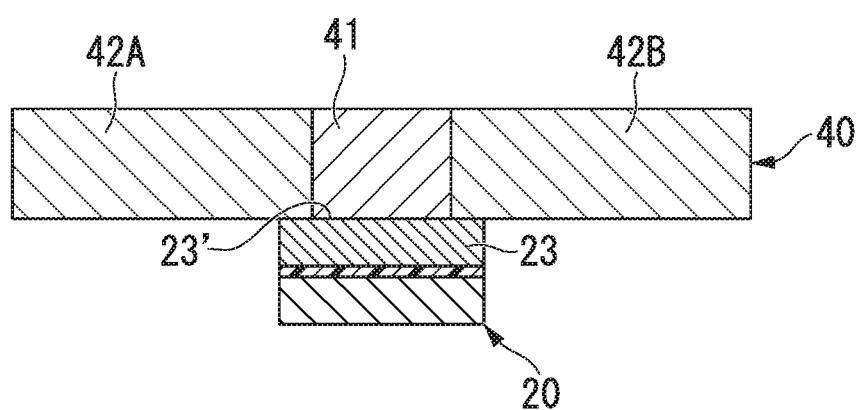
FIG. 4 is a schematic view illustrating a spin-orbit torque wiring according to another embodiment.
Figure 4:
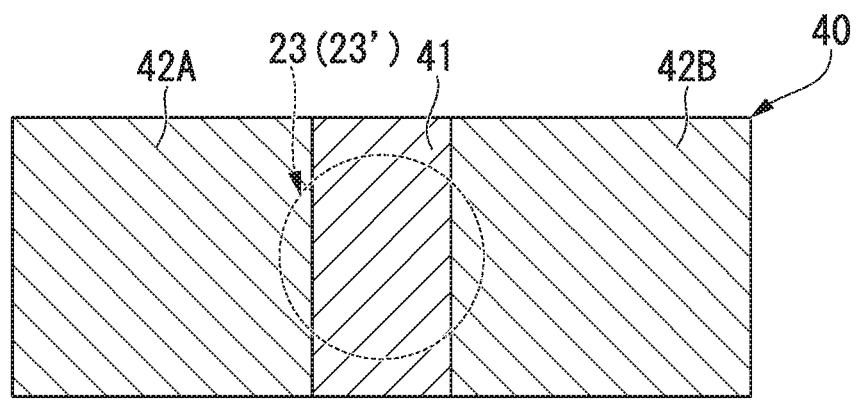

In a spin-orbit torque wiring 40 illustrated in FIG. 4, a spin current generating part 41 thereof overlaps with a part of a junction 23' of a second ferromagnetic metal layer 23 in the plan view from the lamination direction of a magnetoresistance effect element part 20. A portion of the spin-orbit torque wiring 40 overlapping with the magnetoresistance effect element part 20 in the thickness direction is formed only from the spin current generating part 41, and low resistance parts 42A and 42B have the spin current generating part 41 interposed therebetween in a direction in which the current flows.

Figure 5:
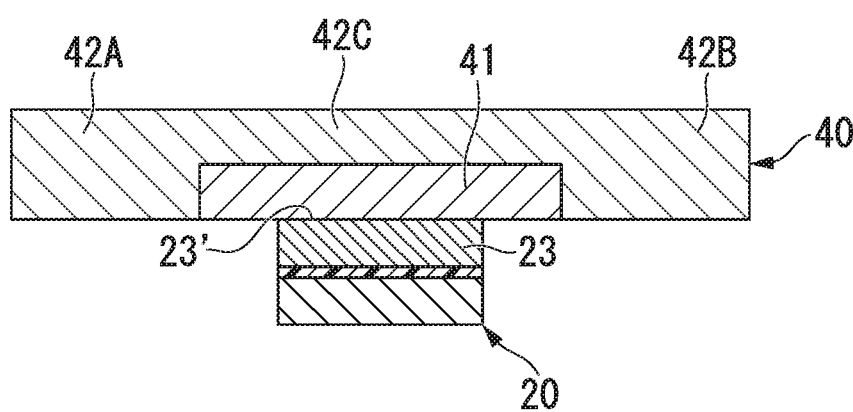
FIG. 5 is a schematic view illustrating a spin-orbit torque wiring according to another embodiment.
Figure 5:
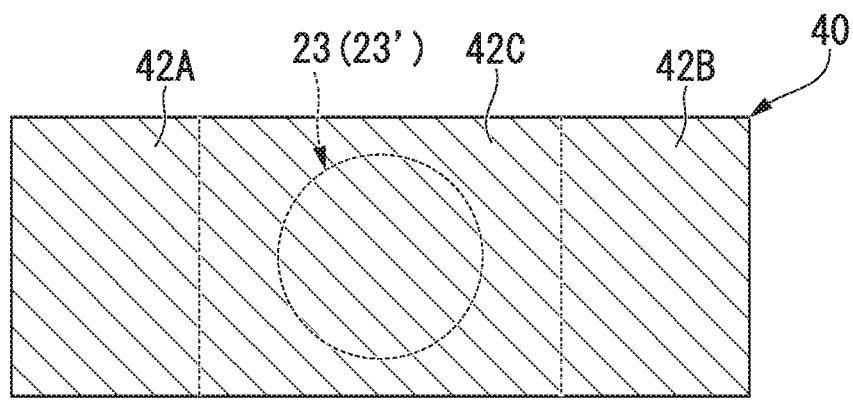

In a spin-orbit torque wiring 40 illustrated in FIG. 5, a spin current generating part 41 thereof overlaps with a junction 23' of a second ferromagnetic metal layer 23 to be included therein in the plan view from the lamination direction of a magnetoresistance effect element part 20. In a portion of the spin-orbit torque wiring 40 overlapping with the magnetoresistance effect element part 20 in the thickness direction, the spin current generating part 41 and a low resistance part 42C are sequentially stacked from the second ferromagnetic metal layer 23 side. Low resistance parts 42A and 42B are disposed to have the portion in which the spin current generating part 41 and the low resistance part 42C are stacked interposed therebetween. As a modified example of the spin-orbit torque wiring illustrated in FIG. 5, a spin current generating part may overlap with a junction of a second ferromagnetic metal layer in the plan view from the lamination direction of the magnetoresistance effect element part. In the modified example, points other than the difference are the same as those of the spin-orbit torque wiring illustrated in FIG. 5.

Figure 6:
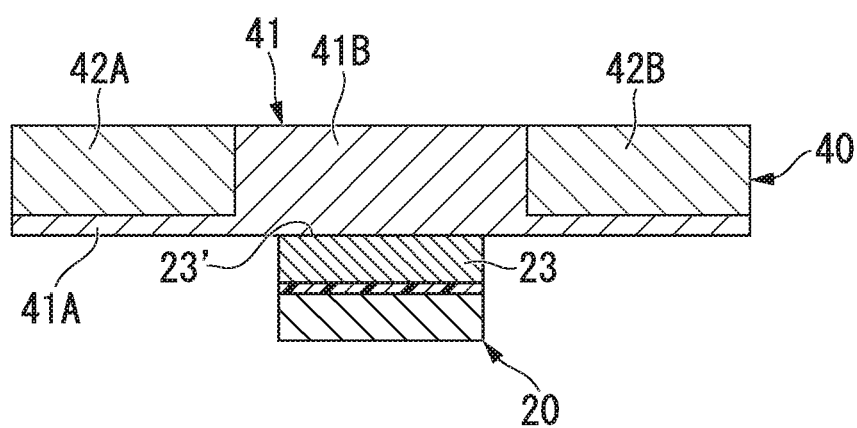
FIG. 6 is a schematic view illustrating a spin-orbit torque wiring according to another embodiment.
Figure 6:
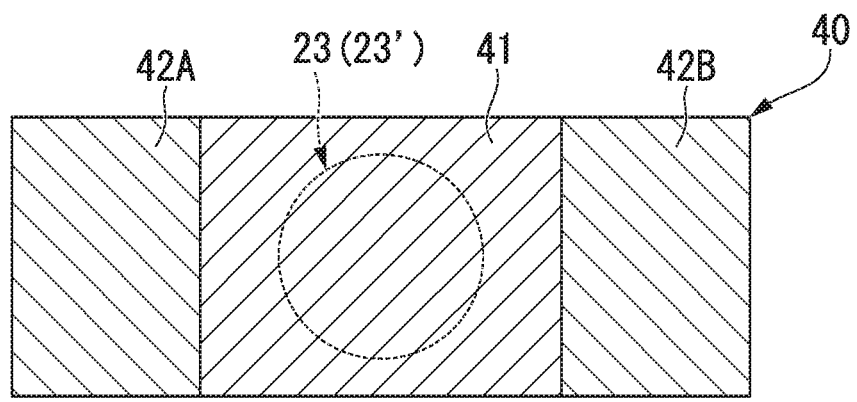

A spin current generating part 41 of a spin-orbit torque wiring 40 illustrated in FIG. 6 includes a first spin current generating part 41A and a second Spin current generating part 41B. The first spin current generating part 41A is formed on the whole one face of a second ferromagnetic metal layer. The second Spin current generating part 41B is stacked on the first spin current generating part 41A and overlaps with a junction 23' of a second ferromagnetic metal layer 23 to be included therein in the plan view from the lamination direction of the magnetoresistance effect element part 20. In a direction of the second Spin current generating part 41B in which a current flows, low resistance parts 42A and 42B are disposed to have the second Spin current generating part 41B interposed therebetween. As a modified example of the spin-orbit torque wiring illustrated in FIG. 6, a second Spin current generating part 41B may overlap with a junction of a second ferromagnetic metal layer in the plan view from the lamination direction of the magnetoresistance effect element part. In the modified example, points other than the difference are the same as those of the spin-orbit torque wiring illustrated in FIG. 6.

In the configuration illustrated in FIG. 6, an area in which the spin current generating part 41 and the low resistance part 42 are in contact with each other is large, and accordingly, adhesiveness between a nonmagnetic metal, which has a large atomic number, composing the spin current generating part 41 and a metal composing the low resistance part 42 is high.

"Method of Manufacturing Spin Current Assisted Magnetoresistance Effect Element"

A spin current assisted magnetoresistance effect element can be manufactured using a known method. Hereinafter, methods of manufacturing the spin current assisted magnetoresistance effect elements illustrated in FIGS. 3 to 6 will be described.

The magnetoresistance effect element part 20, for example, can be formed using a magnetron sputter device. In a case in which the magnetoresistance effect element part 20 is a TMR element, for example, for a tunnel barrier layer, first, aluminum of about 0.4 to 2.0 nm and a plurality of metal thin films of bivalent positive ions of nonmagnetic elements are sputtered on the first ferromagnetic metal layer. Thereafter, the metal films are naturally oxidized through plasma oxidation or introduction of oxygen and are heat-treated, whereby a nonmagnetic layer formed from oxide films is formed. As a method of forming films, a thin film forming method Such as an evaporation method, a laser ablation method, or an MBE method other than a magnetron sputtering method may be used.

After film formation and Shape formation of the magnetoresistance effect element part 20 are performed, it is preferable to form the spin current generating part 41, first. By flattening the interface between the spin current generating part 41 and the magnetoresistance effect element part 20, the scattering of a pure spin current at the time of injecting spin into the magnetoresistance effect element part 20 from the spin current generating part 41 can be suppressed as possibly as can.

After the film formation and the shape formation of the magnetoresistance effect element part 20 are performed, by burying the periphery of the magnetoresistance effect element part 20 after processing in a resist or the like, faces including an upper face of the magnetoresistance effect element part 20 are formed. It is preferable to flatten the upper face of the magnetoresistance effect element part 20. By performing the flattening, spin scattering on the interface between the spin current generating part 41 and the magnetoresistance effect element part 20 can be suppressed.

Next, a material of the spin current generating part 41 is formed on the upper face of the flattened magnetoresistance effect element part 20 as a film. For the film formation, sputtering or the like may be used.

Next, a resist or a protection film is disposed in a portion in which the spin current generating part 41 is to be manufactured, and an unnecessary part is removed using an ion milling method or a reactive ion etching (RIE) method.

Next, a material composing the low resistance part 42 is formed as a film through sputtering or the like, and the resist or the like is peeled off, whereby the spin-orbit torque wiring 40 is manufactured. In a case in which the shape of the spin current generating part 41 is complex, the formation of the resist or the protection film and the film formation of the spin current generating part 41 may be performed in a divisional manner for a plurality of number of times.

"Action of Spin Current Assisted Magnetoresistance Effect Element"

Figure 7:
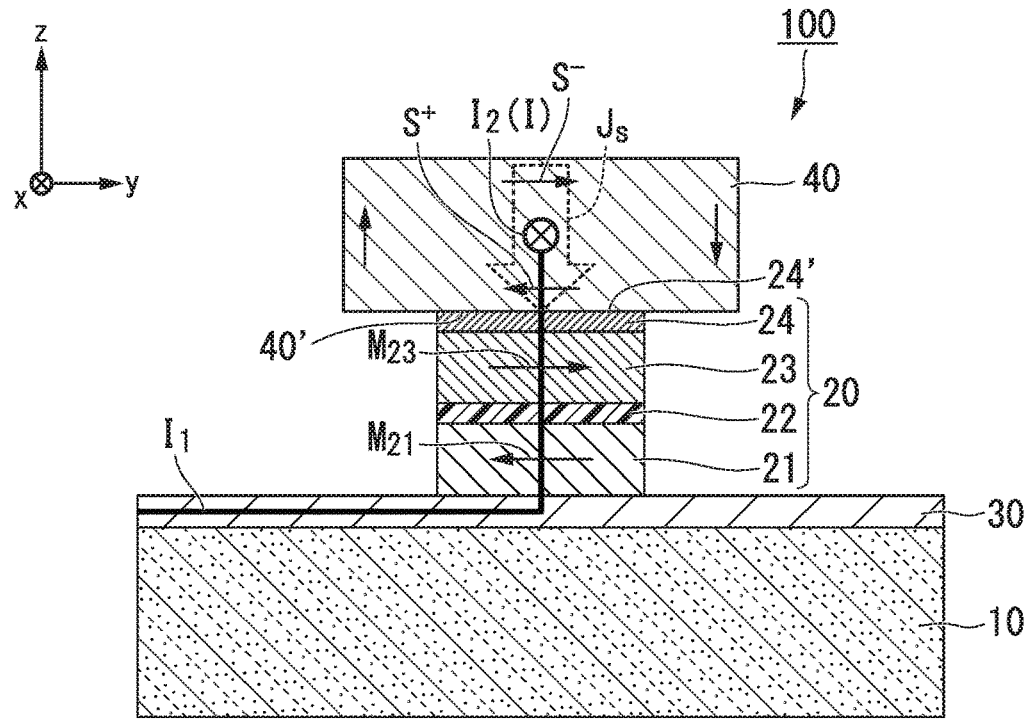
FIG. 7 is a cross-sectional schematic view of a spin current assisted magnetoresistance effect element according to one embodiment taken along an yz plane.

FIG. 7 is a cross-sectional schematic view of a spin current assisted magnetoresistance effect element according to one embodiment of the present invention taken along an yz plane.

The action of the spin current assisted magnetoresistance effect element 100 according to one embodiment of the present invention will be described with reference to FIG. 7.

As illustrated in FIG. 7, in the spin current assisted magnetoresistance effect element 100, there are two types of currents. One is a current $I_1$ (STT inversion current) that flows through the magnetoresistance effect element part 20 in the lamination direction and flows through the spin-orbit torque wiring 40 and the wiring 30. The other one is a current $I_2$ (SOT inversion current) that flows in the extending direction of the spin-orbit torque wiring 40. In the case illustrated in FIG. 7, the current $I_1$ flows in the order of the spin-orbit torque wiring 40, the magnetoresistance effect element part 20, and the wiring 30. In this case, electrons flow in the order of the wiring 30, the magnetoresistance effect element part 20, and the spin-orbit torque wiring 40.

The current I1 and the current I2 intersect (orthogonal intersect) with each other. In a portion in which the magnetoresistance effect element part 20 and the spin-orbit torque wiring 40 are bonded, a reference sign 24' represents a junction of the magnetoresistance effect element part 20 (cap layer 24) side, and a reference sign 40' represents a junction of the spin-orbit torque wiring 40 side. A current flowing through the magnetoresistance effect element part 20 and a current flowing through the spin-orbit torque wiring 40 merge or are divided at these junctions.

In accordance with the flow of the current $I_1$, electrons having spin toward the same direction as that of the magnetization of the first ferromagnetic metal layer (fixed layer) 21 pass through the nonmagnetic layer 22 from the first ferromagnetic metal layer (fixed layer) 21 with the direction of the spin maintained. These electrons generate torque (STT) causing the orientation of magnetization $M_{23}$ of the second ferromagnetic metal layer (free layer) 23 to be reversed and be in parallel with the orientation of magnetization $M_{21}$ of the first ferromagnetic metal layer (fixed layer) 21.

Meanwhile, the current $I_2$ corresponds to the current I illustrated in FIG. 2. In other words, when the current $I_2$ flows, a pure spin current $J_s$ that causes upward Spin $S^+$ and downward Spin $S^-$ to be bent toward the end portion of the spin-orbit torque wiring 40 is generated. The pure spin current $J_s$ is induced in a direction perpendicular to the direction in which the current $I_2$ flows. In other words, the pure spin current $J_s$ is generated in a z-axis direction and a y-axis direction in the drawing. In FIG. 7, only a pure spin current $J_s$ in the z-axis direction contributing to the orientation of the magnetization of the second ferromagnetic metal layer 23 is illustrated.

The pure spin current $J_s$ generated by causing the current $I_2$ to flow through the spin-orbit torque wiring 40 toward the front side of the drawing diffuses to flow into the second ferromagnetic metal layer 23 through the cap layer 24, and the flown-in spin has an influence on the magnetization $M_{23}$ of the second ferromagnetic metal layer 23. In other words, In the case illustrated in FIG. 7, when spin toward a −y direction flows into the second ferromagnetic metal layer 23, torque (SOT) causing magnetization reversal of the magnetization $M_{23}$ of the second ferromagnetic metal layer 23 toward a +y direction is applied.

As above, an SOT effect according to a pure spin current $J_s$ occurring in accordance with a current flowing through a second current path $I_2$ is added to an STT effect occurring in accordance with a current flowing through a first current path $I_1$, and thus, the magnetization $M_{23}$ of the second ferromagnetic metal layer 23 is reversed.

When the magnetization of the second ferromagnetic metal layer 23 is to be reversed using only the STT effect (in other words, a current flows only through the current path $I_1$), it is necessary to apply a predetermined voltage or more to the magnetoresistance effect element part 20. Although a general driving voltage of a TMR element is relatively low as being several Volts or less, the nonmagnetic layer 22 is a very thin film of about several nm, and insulation destruction may occur therein. When the conduction of the nonmagnetic layer 22 is continued, a weak portion (bad film quality, a thin film thickness, or the like) of the nonmagnetic layer is destroyed in terms of a probability.

On the other hand, when the magnetization $M_{23}$ of the second ferromagnetic metal layer 23 is to be reversed using only the SOT effect, it is necessary to increase the current density of a current flowing through the spin-orbit torque wiring 40. Flowing a large amount of current is not desirable in the aspect of energy efficiency. In addition, while there is a report describing that magnetization reversal using the SOT can be performed by setting the current density to be $5.0×10^7$ A/cm$^2$ or more, there is a problem in the aspect of reproducibility even when a current having a current density of such an amount is caused to flow.

In contrast to this, the spin current assisted magnetoresistance effect element according to this embodiment uses an SOT effect in addition to an STT effect. For this reason, a voltage applied to the magnetoresistance effect element part can be decreased, and the current density of a current flowing through the spin-orbit torque wiring can be decreased. By decreasing the voltage applied to the magnetoresistance effect element part, the probability of insulation destruction of the nonmagnetic layer can be decreased. In addition, by decreasing the current density of the current flowing through the spin-orbit torque wiring, a marked decrease in energy efficiency required for magnetization reversal can be avoided.

It is preferable that the current density of the current flowing through the spin-orbit torque wiring be less than $1×10^7$ A/cm$^2$. When the current density of the current flowing through spin-orbit torque wiring is too high, heat is generated in accordance with the current flowing through the spin-orbit torque wiring. When heat is applied to the second ferromagnetic metal layer, the stability of magnetization of the second ferromagnetic metal layer disappears, and there are cases in which unexpected magnetization reversal or the like may occur. When such unexpected magnetization reversal occurs, there is a problem in that recorded information is rewritten. In other words, in order to avoid unexpected magnetization reversal, it is preferable that the current density of the current flowing through spin-orbit torque wiring becomes not too high. When the current density of the current flowing through the spin-orbit torque wiring is less than $1×10^7$ A/cm$^2$, at least the occurrence of magnetization reversal according to generated heat can be avoided.

Figure 8:
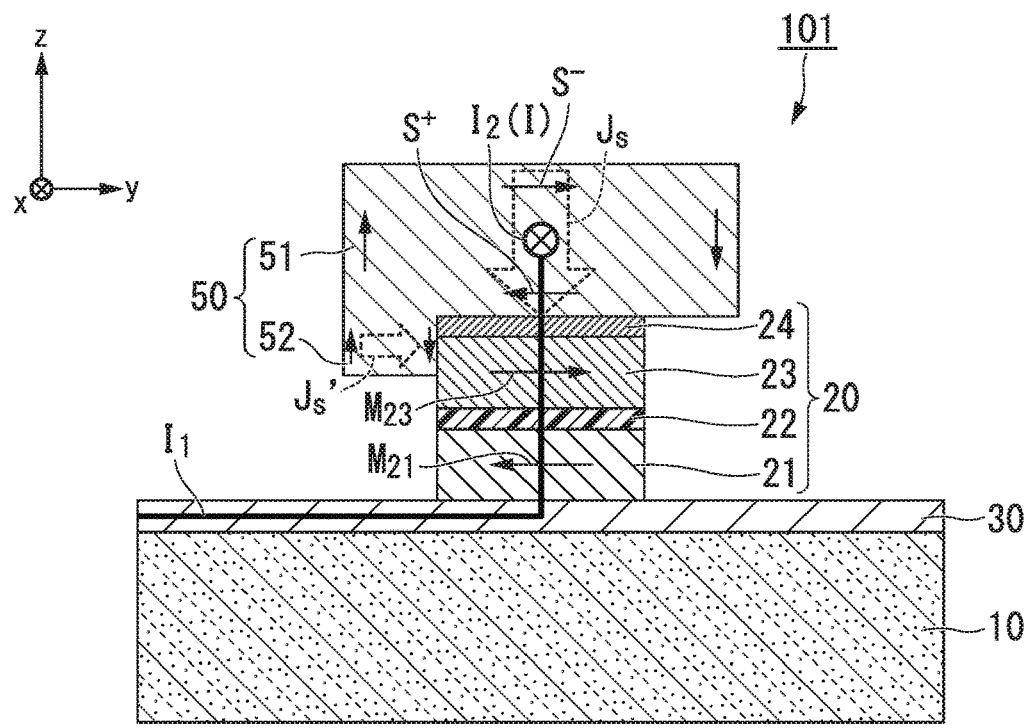
FIG. 8 is a cross-sectional schematic view of a spin current assisted magnetoresistance effect element according to another embodiment taken along an yz plane.

FIG. 8 illustrates a spin current assisted magnetoresistance effect element according to another embodiment of the present invention.

In the spin current assisted magnetoresistance effect element 101 illustrated in FIG. 8, the spin-orbit torque wiring 50 includes a side-wall junction 52 bonded to a side wall of a second ferromagnetic metal layer 23 in addition to an upper-face junction 51 (corresponding to the spin-orbit torque wiring 40 described above) provided in the lamination direction of a magnetoresistance effect element part 20).

When a current flows through the spin-orbit torque wiring 50, a pure spin current $J_s'$ is generated in the side-wall junction 52 in addition to a pure spin current $J_s$ generated in the upper-face junction 51.

Thus, not only the pure spin current $J_s$ flows from the upper face of the magnetoresistance effect element part 20 to the second ferromagnetic metal layer 23 through the cap layer 24, but also the pure spin current $J_s'$ flows from the side wall of the second ferromagnetic metal layer 23, whereby the SOT effect is reinforced.

Figure 9:
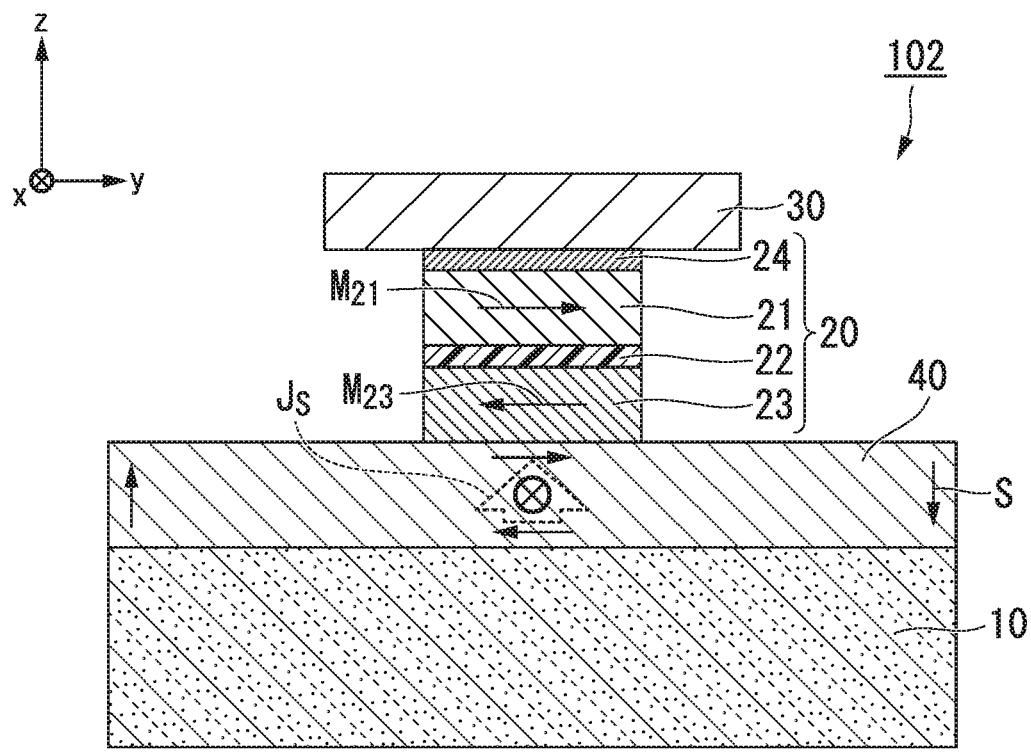
FIG. 9 is a cross-sectional schematic view of a spin current assisted magnetoresistance effect element according to another embodiment taken along an yz plane.

FIG. 9 illustrates a spin current assisted magnetoresistance effect element according to another embodiment of the present invention.

The spin current assisted magnetoresistance effect element 102 illustrated in FIG. 9 includes a spin-orbit torque wiring 40 on the substrate 10 side. In this case, the stacking order of a first ferromagnetic metal layer 21 that is a fixed layer and a second ferromagnetic metal layer 23 that is a free layer is opposite to that of the spin current assisted magnetoresistance effect element 100 illustrated in FIG. 1.

In the spin current assisted magnetoresistance effect element 102 illustrated in FIG. 9, a substrate 10, a spin-orbit torque wiring 40, the second ferromagnetic metal layer 23, a nonmagnetic layer 22, the first ferromagnetic metal layer 21, a cap layer 24, and a wiring 30 are stacked in this order. Since the second ferromagnetic metal layer 23 is stacked before the first ferromagnetic metal layer 21, the possibility of reception of the influence of lattice distortion or the like is lower than that of the spin current assisted magnetoresistance effect element 100 illustrated in FIG. 1. As a result, in the spin current assisted magnetoresistance effect element 102, vertical magnetic anisotropy of the second ferromagnetic metal layer 23 can be increased. When the vertical magnetic anisotropy of the second ferromagnetic metal layer 23 is increased, the MR ratio of the spin current assisted magnetoresistance effect element is increased.

"Time of Application of STT Inversion Current and SOT Inversion Current"

Subsequently, times at which an STT inversion current ($I_1$ illustrated in FIG. 7) and an SOT inversion current ($I_2$ illustrated in FIG. 7) are applied to the spin current assisted magnetoresistance effect element will be described. The times at which currents are applied to the spin current assisted magnetoresistance effect element are controlled by the controller 110 (see FIG. 1).

Figure 10:
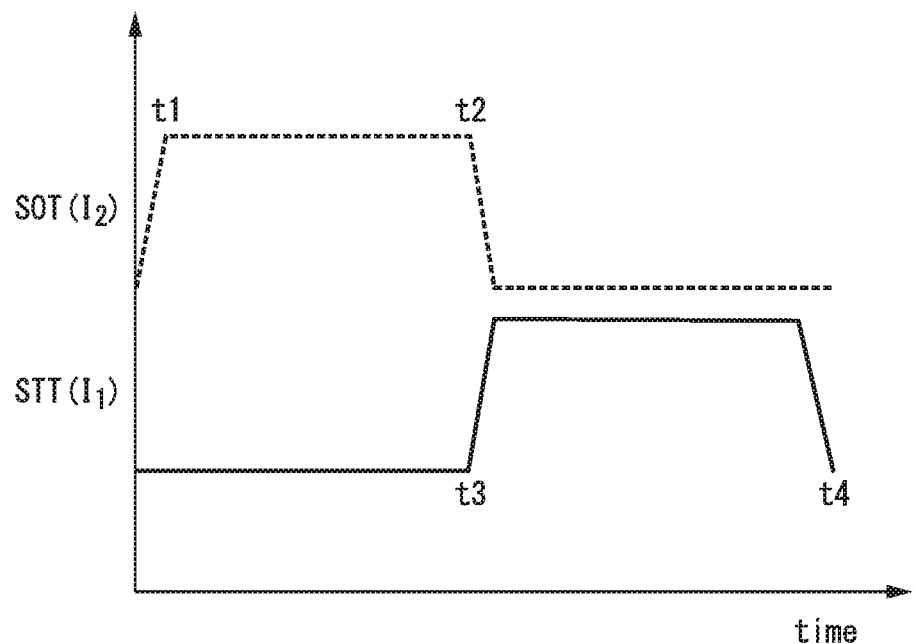
FIG. 10 is a diagram illustrating one example illustrating application times of an STT inversion current and an SOT inversion current.

FIG. 10 is a diagram illustrating one example illustrating application times of an STT inversion current and an SOT inversion current. FIG. 10 is an output waveform of the STT inversion current and the SOT inversion current, and the horizontal axis is time. A time at which the application of the SOT inversion current is started is a time t1, a time at which the application of the SOT inversion current is stopped is a time t2, a time at which the application of the STT inversion current is started is a time t3, and a time at which the application of the STT inversion current is stopped is a time t4.

In this embodiment, the controller 110 applies the STT inversion current to the spin current assisted magnetoresistance effect element at the same time as an application of the SOT inversion current or a time after that of the SOT inversion current. In other words, the time t3 is the same as the time t1 or is later than the time t1.

When the SOT inversion current and the STT inversion current are applied at such times, a time required for the magnetization reversal of the magnetoresistance effect element part can be shortened, and the recording speed of the spin current assisted magnetoresistance effect device is increased. The reason for this will be described.

Figure 11:
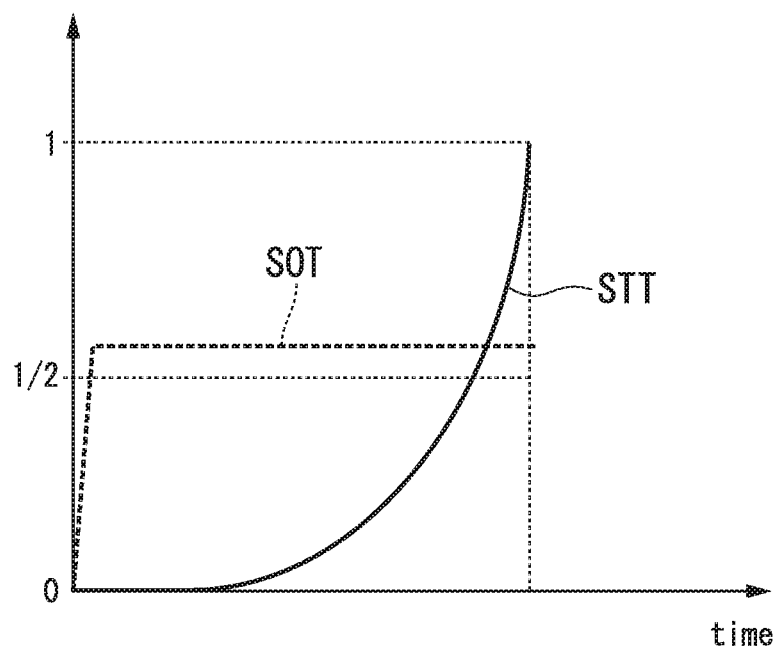
FIG. 11 is a diagram schematically illustrating the behaviors of magnetization reversal using an STT effect and magnetization reversal using an SOT effect.

As described also in Non Patent Literature 2, a mechanism for the magnetization reversal using the SOT effect and a mechanism for the magnetization reversal using the STT effect are different from each other, and behaviors until the magnetization reversal are assumed to be different. FIG. 11 is a diagram schematically illustrating the behaviors of magnetization reversal using an STT effect and magnetization reversal using an SOT effect. The horizontal axis is time, and the vertical axis represents the direction of magnetization of the free layer. In the vertical axis, the direction of magnetization is reversed between "0" and "1".

The STT effect promotes the precession of magnetization of the free layer and contributes to magnetization reversal. For this reason, it is difficult for magnetization reversal to occur even when the STT inversion current is applied unless the trigger of precession of the magnetization is applied in accordance with heat or fluctuation of an external magnetic field or the like. In addition, until energy according to the precession becomes sufficiently large, magnetization inside the free layer is not reversed. For this reason, as illustrated in FIG. 11, there is a time delay until there is an influence of the STT effect on the magnetization reversal after the STT inversion current is applied.

In contrast to this, the SOT effect gives a force for rotating the magnetization of the free layer by 90°, and magnetization reversal occurs when magnetization that excessively rotates becomes a stable arrangement. As illustrated in FIGS. 1a and 1c of Non Patent Literature 2, magnetization does not go through precession of magnetization at the time of starting magnetization reversal, and magnetization reversal occurs. In other words, in a case in which the SOT effect is used, it is not necessary to go through the precession of magnetization, and, as illustrated in FIG. 11, a time delay required until the SOT effect influences on magnetization reversal after the application of the SOT inversion current is short.

Since the STT effect goes through the process of accumulation of energy according to the precession of magnetization, a time is required until magnetization reversal occurs, and, by giving sufficient energy, the stability of the magnetization reversal is increased. Meanwhile, since the SOT effect uses natural mitigation after giving of a force for rotating magnetization by 90°, the stability of the magnetization reversal is lower than that of a case using the STT effect, and a time until the occurrence of magnetization reversal can be shortened to be less than that of a case using the STT effect. Here, the stability of magnetization reversal represents an increase in the probability of the magnetization reversal and represents an increase in the ratio of reversed magnetization among a plurality of magnetizations.

Accordingly, when an STT inversion current is applied to the spin current assisted magnetoresistance effect element at a time that is after an application of the SOT inversion current (the time t3 after the time t1), the STT effect can be used after the use of the SOT effect, and a time required for magnetization reversal can be decreased, and the stability of the magnetization reversal can be increased.

In addition, in a case in which an SOT inversion current and an STT inversion current are simultaneously applied to the spin current assisted magnetoresistance effect element (time t1=time t3), the trigger of precession of magnetization can be applied using the SOT effect, and a time required for magnetization reversal can be decreased.

Here, as illustrated in FIG. 7, in a case in which the direction of magnetization of the second ferromagnetic metal layer 23 and the direction of spin supplied from the spin-orbit torque wiring 40 to the second ferromagnetic metal layer 23 are in parallel or antiparallel, it is preferable to simultaneously apply the SOT inversion current and the STT inversion current.

When the direction of magnetization of the second ferromagnetic metal layer 23 and the direction of spin supplied to the second ferromagnetic metal layer 23 are in parallel or antiparallel, a relative angle between the magnetization of the second ferromagnetic metal layer 23 and Supplied Spin becomes zero, and accordingly, it is difficult to give torque to the magnetization of the second ferromagnetic metal layer 23. For this reason, in order to cause magnetization reversal, it is necessary to generate precession of magnetization using fluctuation of the relative angle between the magnetization and the supplied Spin (see FIG. 1b of Non Patent Literature 2).

When the SOT inversion current and the STT inversion current are simultaneously applied, a trigger for applying torque to magnetization is given using the SOT effect, and the STT effect can be superimposed thereon before the trigger disappears. In other words, by increasing contribution of the STT effect from an initial stage at the time of causing magnetization reversal, the precession of the magnetization can be promoted.

Figure 12:
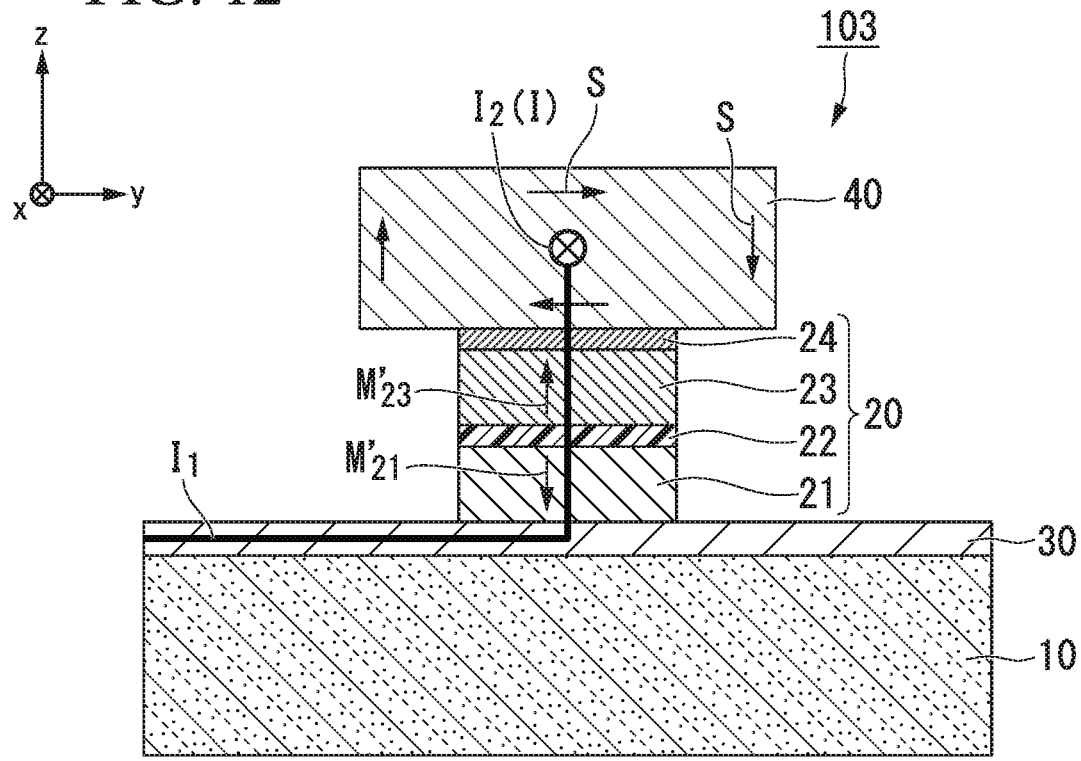
FIG. 12 is a cross-sectional schematic view of a spin current assisted magnetoresistance effect element according to another embodiment taken along an yz plane.

In contrast to this, as illustrated in FIG. 12, in a case in which the direction of magnetization of the second ferromagnetic metal layer 23 and the direction of spin supplied from the spin-orbit torque wiring 40 to the second ferromagnetic metal layer 23 intersect each other, it is preferable to apply an STT inversion current after the application of an SOT inversion current.

FIG. 12 is a cross-sectional schematic view of the spin current assisted magnetoresistance effect element 103 of a case in which the direction of magnetization M'23 of the second ferromagnetic metal layer 23 and the direction of spin supplied from the spin-orbit torque wiring 40 to the second ferromagnetic metal layer 23 intersect each other that is taken along an yz plane. Points other than that the magnetization M'21 of the first ferromagnetic metal layer 21 faces toward the lamination direction of the magnetoresistance effect element part 20 are similar to those of the case illustrated in FIG. 7, and thus, a same reference sign is assigned to the same configuration.

In a case in which the direction of magnetization of the second ferromagnetic metal layer 23 and direction of spin supplied to the second ferromagnetic metal layer 23 intersect each other, compared to the case of being in parallel or antiparallel, it is easy to give torque to the magnetization. For this reason, torque for causing magnetization reversal of the magnetization can be given immediately after the application of a current (see 1a and 1c of Non Patent Literature 2). As illustrated in FIG. 11, since the SOT inversion current can give influence on the magnetization more quickly than the STT inversion current, by increasing the contribution ratio according to the SOT effect for magnetization reversal in an initial period, the magnetization reversal can be promoted more quickly.

In addition, in this embodiment, it is preferable that the controller 110 stop the application of the STT inversion current to the spin current assisted magnetoresistance effect element at a time after applying the SOT inversion current (a time t4 is after the time t2).

While the SOT effect gives a force rotating the magnetization by 90°, torque given to the magnetization is weakened near 90° rotation. For this reason, even when the application of only the SOT inversion current is continued, there are cases in which magnetization facing toward unstable orientation (near ½ in a vertical axis in FIG. 11) faces toward a direction opposite to an originally-assumed direction in accordance with reception of the influence of heat or the like. In contrast to this, when the STT inversion current is applied up to the end, energy that is sufficient for causing magnetization reversal can be given, and accordingly, the magnetization reversal can be caused more reliably.

In a case in which a time until stopping the application of the SOT inversion current and the STT inversion current after the application of the SOT inversion current is sufficiently long, the order in which the application of the SOT inversion current and the STT inversion current is stopped is not particularly limited. However, from a viewpoint of a longer life, high-speed driving, and the like of the spin current assisted magnetoresistance effect device, it is preferable that a time period of the applied current be short. For example, it is preferable that a time until stopping the application of the SOT inversion current and the STT inversion current after the application of the SOT inversion current be 10 nsec or less.

As described above, when the application of the STT inversion current to the spin current assisted magnetoresistance effect element is stopped after applying the SOT inversion current, even in a case in which the application time of the SOT inversion current and the STT inversion current is short, magnetization reversal can be performed more reliably.

In addition, in this embodiment, it is preferable that the controller 110 stop the application of the SOT inversion current after the application of the STT inversion current to the spin current assisted magnetoresistance effect element or simultaneously with the application (the time t2 is after the time t3 or simultaneous therewith).

The SOT effect does not disappear simultaneously with the stopping of the application of the SOT inversion current. In other words, there is a time delay until the SOT effect disappears after stopping the application of the SOT inversion current.

One of the reasons thereof is that there is a limited life of a spin current generated in accordance with the SOT effect. A spin current generated in a material reduces by half in the time of the spin life. It is known that the spin life is about 10 to 100 ps in the case of a general metal such as Al, Cu, or Ag and is about 1 ns to 1 ms in the case of a semiconductor such as Si or an organic material.

Another reason is a time until spin rotated in accordance with the SOT effect is settled into a stable state. For example, a time required for spin inclining from an easily magnetizable axis by about 90 degrees in accordance with the SOT effect to return to the direction of the original easily magnetizable axis, generally, is about 100 ps to 1 ns.

For this reason, when the application of the SOT inversion current is stopped after the application of the STT inversion current or simultaneously with the application thereof, a time at which the SOT effect and the STT effect are superimposed to be added reliably occurs in the process of current application for magnetization reversal.

In other words, when a time from a time at which the application of the SOT inversion current is stopped to a time at which the STT inversion current is applied is at least within 100 ps, the SOT effect reliably remains. The time in which the SOT effect remains is different for each material of the spin-orbit torque wiring. A time from the time at which the application of the SOT inversion current is stopped to the time at which the STT inversion current is applied is at least within 100 ps in a case in which the material of the spin-orbit torque wiring is a metal and is at least within 1 ns in a case in which the material of the spin-orbit torque wiring is a semiconductor.

Figure 13:
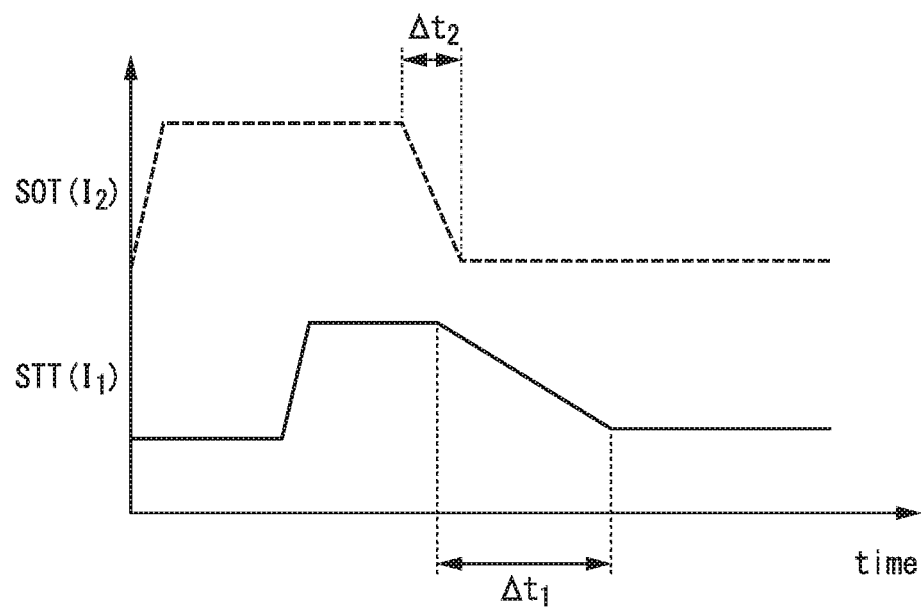
FIG. 13 is a diagram illustrating one example of times of application and cut-off of an STT inversion current and an SOT inversion current.

In addition, as illustrated in FIG. 13, it is preferable that a tail time Δt2 until the applied SOT inversion current becomes zero be shorter than a tail time Δt1 until the applied STT inversion current becomes zero.

As illustrated in FIG. 11, the SOT inversion current gives a force rotating magnetization by 90°. In other words, continuation of the application of the SOT inversion current may be also referred to as continuation of applying a force maintaining the 90°-rotated State for magnetization. Meanwhile, the spin current assisted magnetoresistance effect element is for the purpose of reversing the magnetization. For this reason, it is preferable to shorten the tail time Δt2 and quickly remove the force maintaining the 90°-rotated State.

In contrast to this, as illustrated in FIG. 11, the STT inversion current exerts a force reversing the magnetization. For this reason, by lengthening the tail time Δt1, it can be suppressed that, by receiving the influence of external factors such as heat and the like, the magnetization is orientated in a direction different from a direction assumed in terms of the probability.

As described above, by controlling the application time of the STT inversion current and the SOT inversion current to be applied to the spin current assisted magnetoresistance effect element using the controller, a time required for the magnetization reversal of the second ferromagnetic layer can be shortened, and the probability of the occurrence of the magnetization reversal can be increased, and the stability of the magnetization reversal can be increased. In other words, the recording speed of the spin current assisted magnetoresistance device can be increased.

In addition, according to the spin current assisted magnetoresistance effect element of this embodiment, the contribution ratios of the STT and the SOT can be freely controlled using the amount of current supplied from the first power supply and the second power supply. For this reason, the contribution ratios of the STT and the SOT can be freely controlled in accordance with the performance required for a device, and the spin current assisted magnetoresistance effect element can function as a spin current assisted magnetoresistance effect element having higher versatility.

In addition, by controlling the amounts of currents flowing in the lamination direction of the magnetoresistance effect element part 20 and in a direction perpendicular to this lamination direction using two power supplies, the contribution ratios at which the SOT and the STT contribute to magnetization reversal can be freely controlled.

For example, in a case in which a large current cannot flow through a device, the STT having high energy efficiency for magnetization reversal can be controlled to be a main factor. In other words, the amount of current flowing from the first power supply 111 can be increased, and the amount of current flowing from the second power supply 112 can be decreased.

For example, in a case in which a thin device needs to be manufactured, and the thickness of the nonmagnetic layer 22 is forced to be thin, it is requested to decrease a current flowing through the nonmagnetic layer 22. In this case, the amount of current flowing from the first power supply 111 is decreased, the amount of current flowing from the second power supply 112 is increased, whereby the contribution ratio of the SOT can be increased.

(Magnetization Reversing Method)

A magnetization reversing method according to this embodiment is to cause the current density of a current flowing through the spin-orbit torque wiring to be less than $1\times10^7$ A/cm$^2$ in the spin current assisted magnetoresistance effect device described above.

When the current density of the current flowing through the spin-orbit torque wiring is too large, heat is generated in accordance with the current flowing through the spin-orbit torque wiring. When heat participates in the second ferromagnetic metal layer, the stability of the magnetization of the second ferromagnetic metal layer disappears, and there are cases in which unexpected magnetization reversal or the like occurs. When such unexpected magnetization reversal occurs, there is a problem in that recorded information is rewritten. In other words, in order to avoid unexpected magnetization reversal, it is preferable that the current density of the current flowing through the spin-orbit torque wiring be not caused to be too large. When the current density of the current flowing through the spin-orbit torque wiring is less than $1\times10^7$ A/cm$^2$, the occurrence of magnetization reversal due to at least generated heat can be avoided.

REFERENCE SIGNS LIST

10: Substrate
20: Magnetoresistance effect element part
21: First ferromagnetic metal layer
22: Nonmagnetic layer
23: Second ferromagnetic metal layer
23': Junction (second ferromagnetic metal layer side)
24: Cap layer
24': Junction (cap layer side)
30: Wiring
40, 50: Spin-orbit torque wiring
40': Junction (spin-orbit torque wiring side)
41, 41A, 41B: Spin current generating part
42A, 42B, 42C: Low resistance part
100, 101, 102, 103: Spin current assisted magnetoresistance effect element
I: Current
S$^+$: Upward Spin
S$^-$: Downward Spin
M$_{21}$, M$_{23}$, M'$_{21}$, M'$_{23}$: Magnetization
I$_1$: First current path
I$_2$: Second current path
110: Controller
111: First power supply
112: Second power supply

What is claimed is:

1. A spin current assisted magnetoresistance effect device comprising:
a spin current assisted magnetoresistance effect element including a magnetoresistance effect element part, which includes a first ferromagnetic metal layer configured for a magnetization direction to be fixed, a second ferromagnetic metal layer configured for a magnetization direction to be changed, and a nonmagnetic layer interposed between the first ferromagnetic metal layer and the second ferromagnetic metal layer, and a spin-orbit torque wiring extending in a direction intersecting a lamination direction of the magnetoresistance effect element part and bonded to the second ferromagnetic metal layer; and
a controller electrically connected to the magnetoresistance effect element part of the spin current assisted magnetoresistance effect element and the spin-orbit torque wiring,
wherein, in a portion in which the magnetoresistance effect element part of the spin current assisted magnetoresistance effect element and the spin-orbit torque wiring are bonded, an STT inversion current flowing through the magnetoresistance effect element part and an SOT inversion current flowing through the spin-orbit torque wiring merge or are divided,
wherein the controller is configured to be capable of performing control for applying the STT inversion current to the spin current assisted magnetoresistance effect element at the same time as an application of the SOT inversion current or at a time after an application of the SOT inversion current,
the magnetization direction of the first ferromagnetic metal layer is in an in-plane direction parallel to the first ferromagnetic metal layer or in a perpendicular direction vertical to the first ferromagnetic metal layer, and
the magnetization direction of the second ferromagnetic metal layer is in an in-plane direction parallel to the second ferromagnetic metal layer or in a perpendicular direction vertical to the second ferromagnetic metal layer.

2. The spin current assisted magnetoresistance effect device according to claim 1, wherein the nonmagnetic layer is MgAl$_2$O$_4$.

3. The spin current assisted magnetoresistance effect device according to claim 1, wherein the spin-orbit torque wiring contains a topological insulator selected from a group consisting of SnTe, Bi$_{1.5}$Sb$_{0.5}$Te$_{1.7}$Se$_{1.3}$, TlBiSe$_2$, Bi$_2$Te$_3$, and (Bi$_{1-x}$Sb$_x$)$_2$Te$_3$.

4. The spin current assisted magnetoresistance effect device according to claim 1, wherein the spin current assisted magnetoresistance effect device is configured that a current density of a current flowing through the spin-orbit torque wiring is less than $1\times10^7$ A/cm$^2$.

5. The spin current assisted magnetoresistance effect device according to claim 1, wherein the controller is configured to be capable of performing control for stopping an application of the STT inversion current to the spin current assisted magnetoresistance effect element at a time after an application of the SOT inversion current.

6. The spin current assisted magnetoresistance effect device according to claim 1, wherein the controller is configured to be capable of performing control for stopping an application of the SOT inversion current at a time after an application of the STT inversion current to the spin current assisted magnetoresistance effect element or a time that is simultaneous with the application.

7. The spin current assisted magnetoresistance effect device according to claim 1, wherein a time until stopping the application of the SOT inversion current and the STT inversion current after an application of the SOT inversion current is 10 nsec or less.

8. The spin current assisted magnetoresistance effect device according to claim 1, wherein a direction of magnetization of the second ferromagnetic metal layer and a direction of spin supplied from the spin-orbit torque wiring to the second ferromagnetic metal layer intersect each other.

9. The spin current assisted magnetoresistance effect device according to claim 1, wherein a current density of the STT inversion current applied by the controller is lower than a threshold inversion current density required for reversing the magnetization of the second ferromagnetic metal layer of the magnetoresistance effect element part.

10. The spin current assisted magnetoresistance effect device according to claim 1, wherein a tail time until the applied SOT inversion current becomes zero is shorter than a tail time until the applied STT inversion current becomes zero.

11. A spin current assisted magnetoresistance effect device comprising:
a spin current assisted magnetoresistance effect element including a magnetoresistance effect element part, which includes a first ferromagnetic metal layer configured for a magnetization direction to be fixed, a second ferromagnetic metal layer configured for a magnetization direction to be changed, and a nonmagnetic layer interposed between the first ferromagnetic metal layer and the second ferromagnetic metal layer, and a spin-orbit torque wiring extending in a direction intersecting a lamination direction of the magnetoresistance effect element part and bonded to the second ferromagnetic metal layer; and
a controller electrically connected to the magnetoresistance effect element part of the spin current assisted magnetoresistance effect element and the spin-orbit torque wiring,
wherein, in a portion in which the magnetoresistance effect element part of the spin current assisted magnetoresistance effect element and the spin-orbit torque wiring are bonded, an STT inversion current flowing through the magnetoresistance effect element part and an SOT inversion current flowing through the spin-orbit torque wiring merge or are divided,
wherein the controller is configured to be capable of performing control for applying the STT inversion current to the spin current assisted magnetoresistance effect element at the same time as an application of the SOT inversion current or at a time after an application of the SOT inversion current,
the magnetization direction of the first ferromagnetic metal layer is in a perpendicular direction vertical to the first ferromagnetic metal layer,
the magnetization direction of the second ferromagnetic metal layer is in a perpendicular direction vertical to the second ferromagnetic metal layer, and
a thickness of the second ferromagnetic metal to be 2.5 nm or the less.

12. The spin current assisted magnetoresistance effect device according to claim 11, wherein the nonmagnetic layer is $MgAl_2O_4$.

13. The spin current assisted magnetoresistance effect device according to claim 11, wherein the spin-orbit torque wiring contains a topological insulator selected from a group consisting of SnTe, $Bi_{1.5}Sb_{0.5}Te_{1.7}Se_{1.3}$, $TlBiSe_2$, $Bi_2Te_3$, and $(Bi_{1-x}Sb_x)_2Te_3$.

14. The spin current assisted magnetoresistance effect device according to claim 11, wherein the spin current assisted magnetoresistance effect device is configured that a current density of a current flowing through the spin-orbit torque wiring is less than $1\times10^7$ A/cm$^2$.

15. The spin current assisted magnetoresistance effect device according to claim 11, wherein the controller is configured to be capable of performing control for stopping an application of the STT inversion current to the spin current assisted magnetoresistance effect element at a time after an application of the SOT inversion current.

16. A spin current assisted magnetoresistance effect device comprising:
a spin current assisted magnetoresistance effect element including a magnetoresistance effect element part, which includes a first ferromagnetic metal layer configured for a magnetization direction to be fixed, a second ferromagnetic metal layer configured for a magnetization direction to be changed, a nonmagnetic layer interposed between the first ferromagnetic metal layer and the second ferromagnetic metal layer, and a spin-orbit torque wiring extending in a direction intersecting a lamination direction of the magnetoresistance effect element part and bonded to the second ferromagnetic metal layer, and a cap layer formed on a face of the second ferromagnetic metal layer that is opposite to the nonmagnetic layer; and
a controller electrically connected to the magnetoresistance effect element part of the spin current assisted magnetoresistance effect element and the spin-orbit torque wiring,
wherein, in a portion in which the magnetoresistance effect element part of the spin current assisted magnetoresistance effect element and the spin-orbit torque wiring are bonded, an STT inversion current flowing through the magnetoresistance effect element part and an SOT inversion current flowing through the spin-orbit torque wiring merge or are divided, and
wherein the controller is configured to be capable of performing control for applying the STT inversion current to the spin current assisted magnetoresistance effect element at the same time as an application of the SOT inversion current or at a time after an application of the SOT inversion current.

17. The spin current assisted magnetoresistance effect device according to claim 16, wherein
the magnetization direction of the first ferromagnetic metal layer is in an in-plane direction parallel to the first ferromagnetic metal layer or in a perpendicular direction vertical to the first ferromagnetic metal layer, and
the magnetization direction of the second ferromagnetic metal layer is in an in-plane direction parallel to the second ferromagnetic metal layer or in a perpendicular direction vertical to the second ferromagnetic metal layer.

18. The spin current assisted magnetoresistance effect device according to claim 16, wherein the nonmagnetic layer is $MgAl_2O_4$.

19. The spin current assisted magnetoresistance effect device according to claim 16, wherein the spin-orbit torque wiring contains a topological insulator selected from a group consisting of SnTe, $Bi_{1.5}Sb_{0.5}Te_{1.7}Se_{1.3}$, $TlBiSe_2$, $Bi_2Te_3$, and $(Bi_{1-x}Sb_x)_2Te_3$.

20. The spin current assisted magnetoresistance effect device according to claim 16, wherein the spin current assisted magnetoresistance effect device is configured that a current density of a current flowing through the spin-orbit torque wiring is less than $1 \times 10^7$ A/cm².

\* \* \* \* \*